United States Patent [19]
Obikane et al.

[11] Patent Number: 5,828,225
[45] Date of Patent: Oct. 27, 1998

[54] SEMICONDUCTOR WAFER PROBING APPARATUS

[75] Inventors: Tadashi Obikane; Eiji Hayashi, both of Kofu; Ryoichiro Koshi, Yamanashi-ken, all of Japan

[73] Assignee: Tokyo Electron Limited, Tokyo, Japan

[21] Appl. No.: 674,916

[22] Filed: Jul. 3, 1996

[30] Foreign Application Priority Data

Jul. 5, 1995 [JP] Japan ................................... 7-169711
Jun. 8, 1996 [JP] Japan ................................... 8-168269

[51] Int. Cl.$^6$ ................................................. G01R 31/02
[52] U.S. Cl. ................................. 324/758; 324/755
[58] Field of Search ............................. 324/754, 755, 324/758

[56] References Cited

U.S. PATENT DOCUMENTS 4,751,457  6/1988  Veenendaal .......................... 324/758
5,410,259  4/1995  Fujihara .............................. 324/758

OTHER PUBLICATIONS

Patent Abstracts of Japan, vol. 18, No. 414, Aug. 3, 1994, and JP-06-124982, May 6, 1994.
Patent Abstracts of Japan, vol. 95, No. 9, Oct. 31, 1995, JP-07-147306, Jun. 6, 1995.

Primary Examiner—Glenn W. Brown
Attorney, Agent, or Firm—Oblon, Spivak, McClelland, Maier & Neustadt, P.C.

[57] ABSTRACT

A probing apparatus has an apparatus body and a test head detachable from the apparatus body. A probe card having a plurality of probe needles to be brought into contact with a semiconductor wafer is supported by the test head. Three engaging rods are disposed on the test head around the probe card to receive the load of the test head in a distributed manner. A vertically movable work table is disposed on the apparatus body to place a substrate thereon. Two first support mechanisms and one second support mechanism are disposed on the apparatus body around the work table to support the test head such that the probe card opposes the work table. The support mechanisms detachably engage with the engaging rods and support the test head through the engaging rods. The first support mechanisms have elevating mechanisms for moving the test head in the vertical direction through the engaging rods. When the test head is moved by the elevating mechanisms, the inclination of the probe card with respect to the wafer placed on the work table is adjusted.

21 Claims, 14 Drawing Sheets

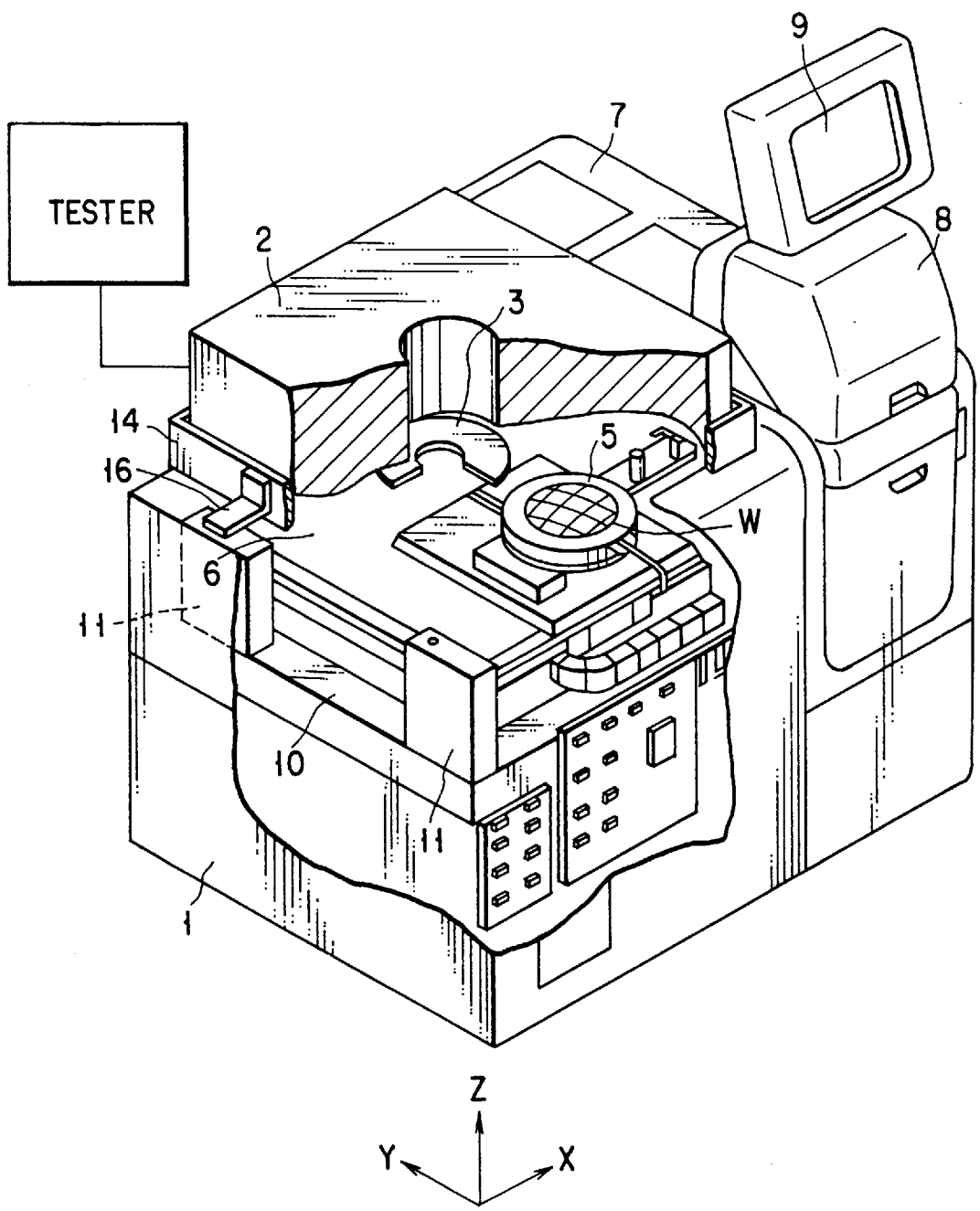
F I G. 1

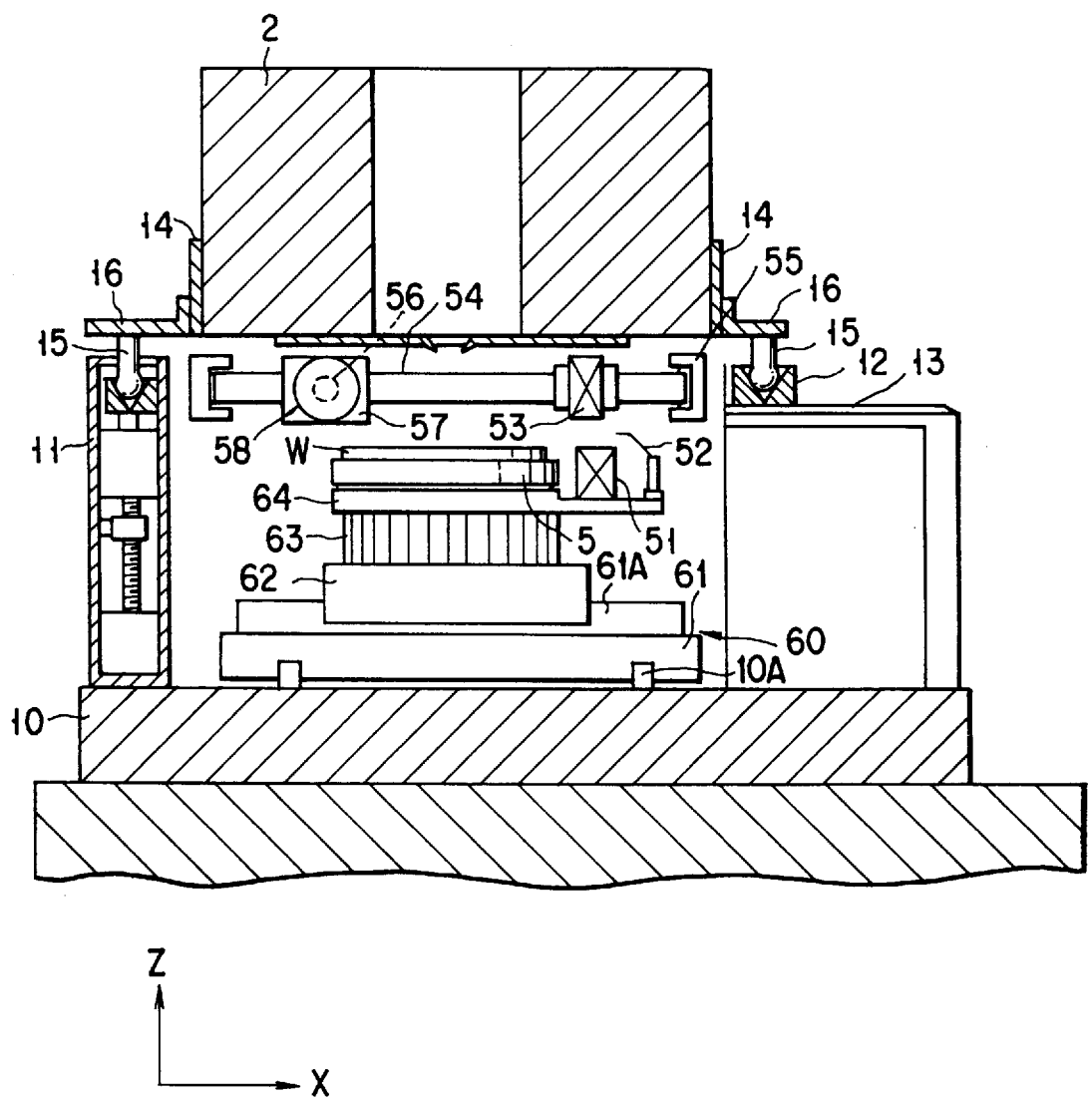
F I G. 2

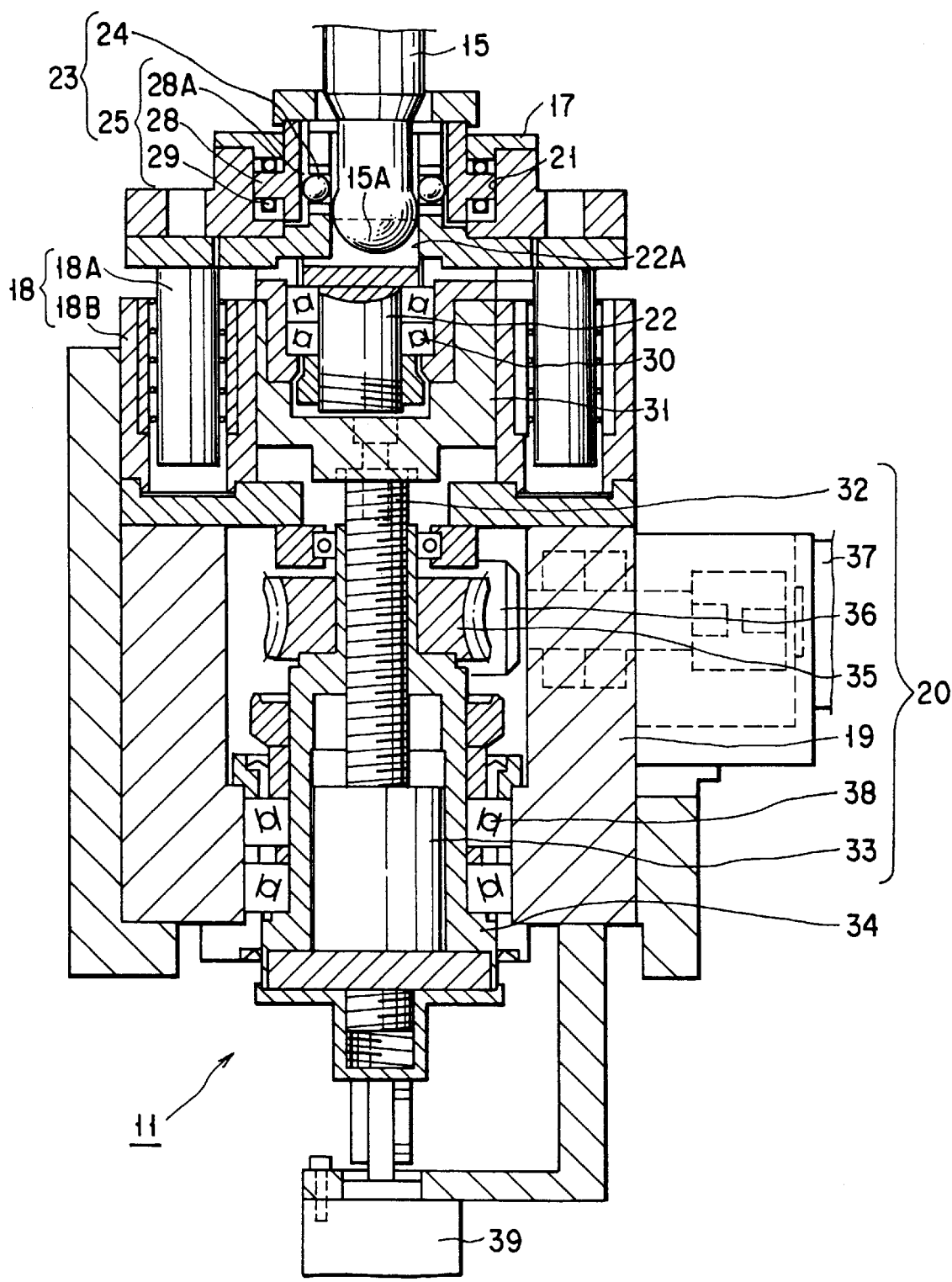
F I G. 3

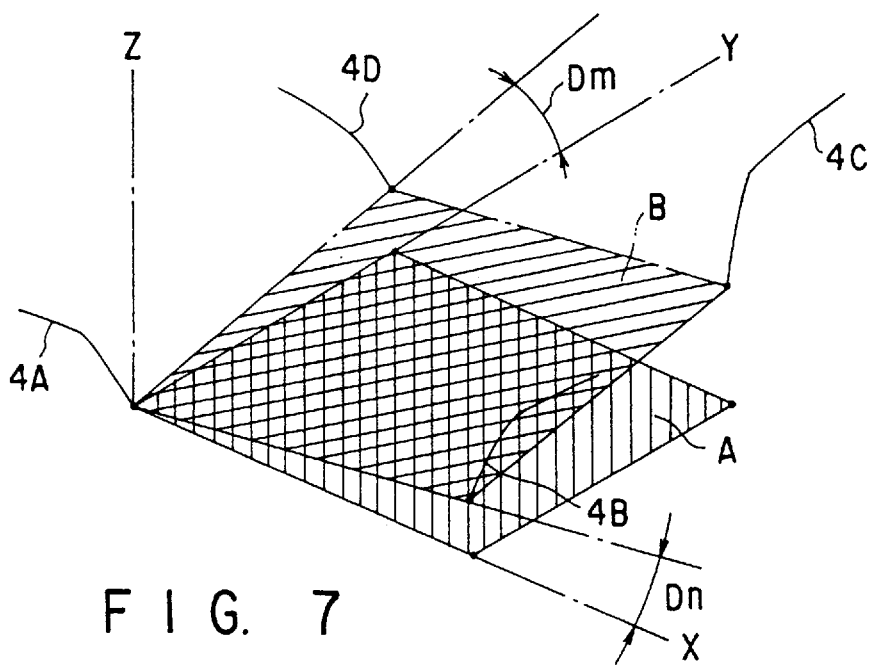
F I G. 7
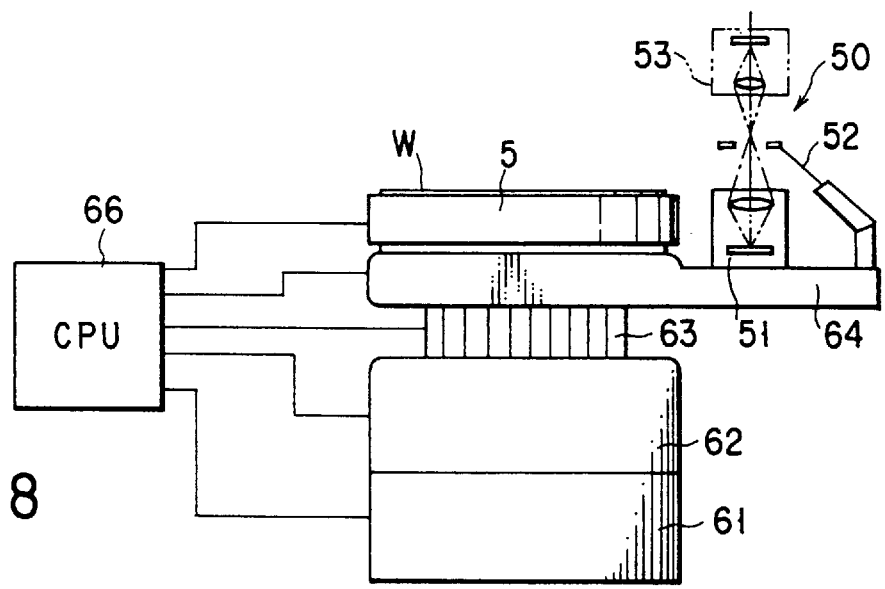
F I G. 8

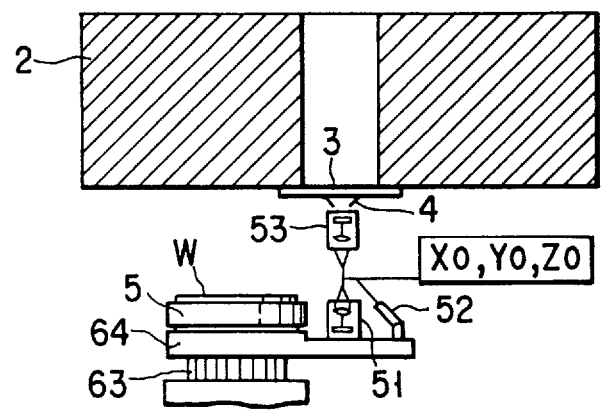
F I G. 9A
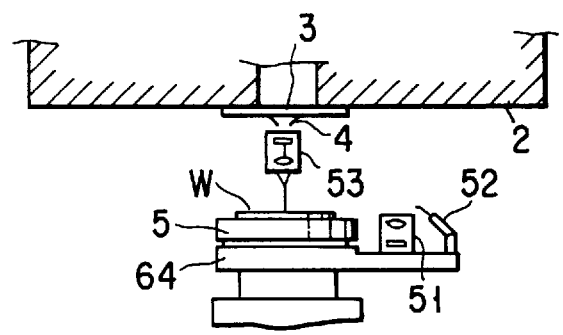
F I G. 9B
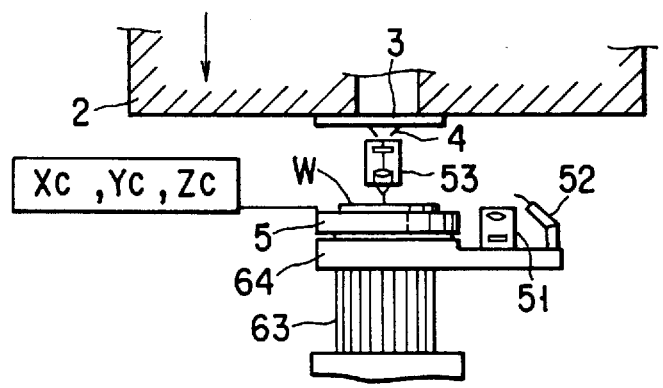
F I G. 9C
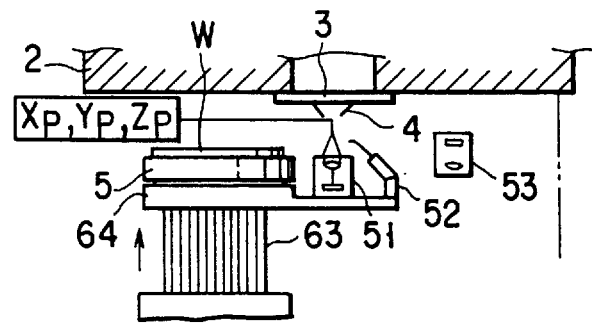
F I G. 9D

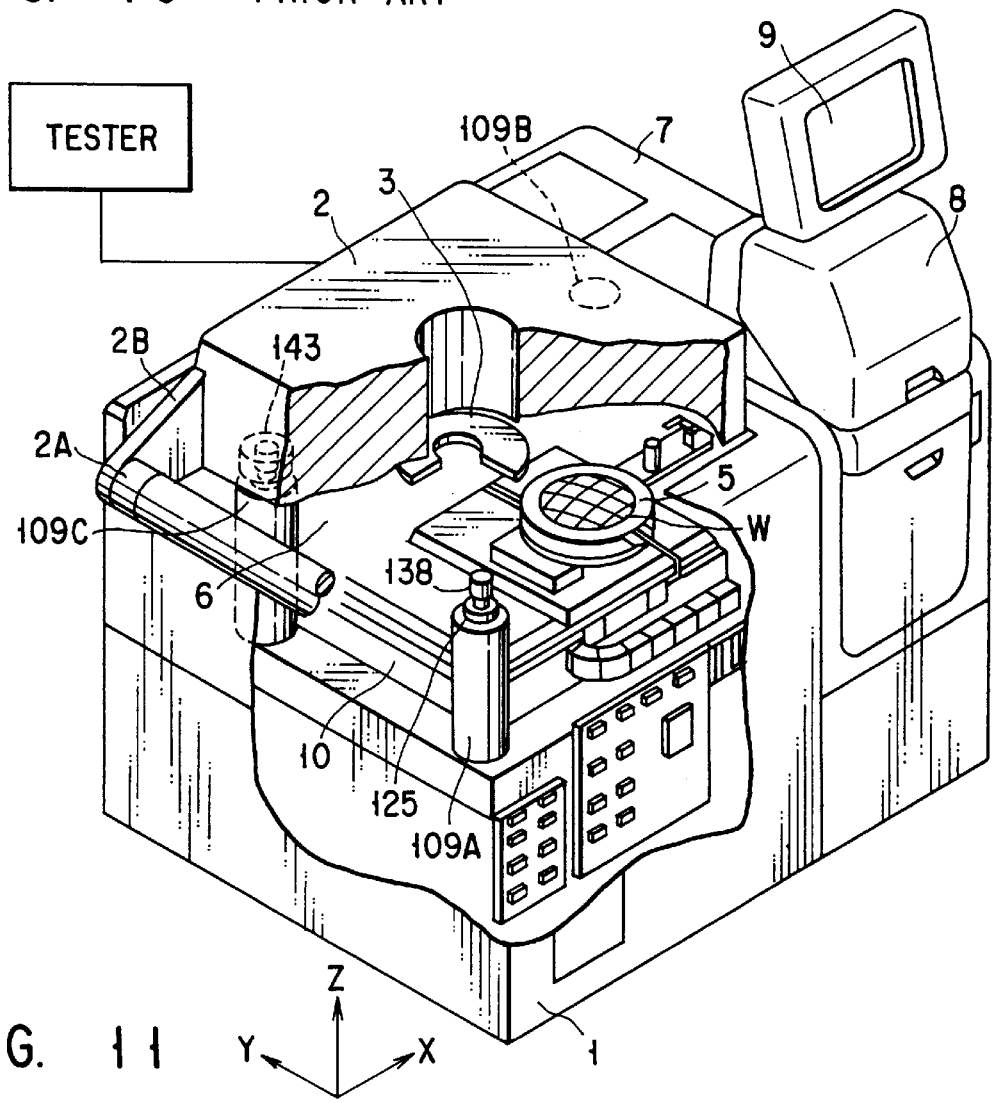
F I G. 11

FIG. 15
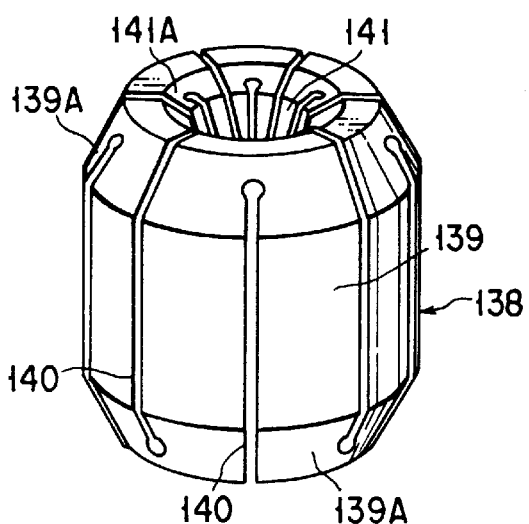
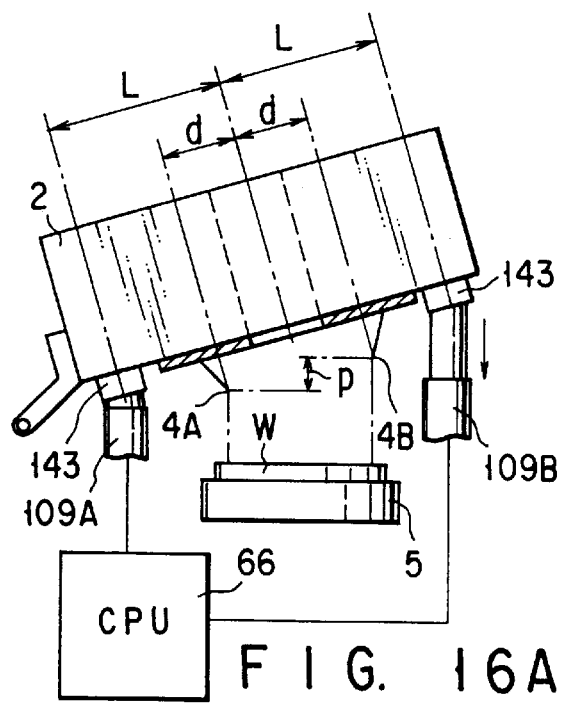
FIG. 16A
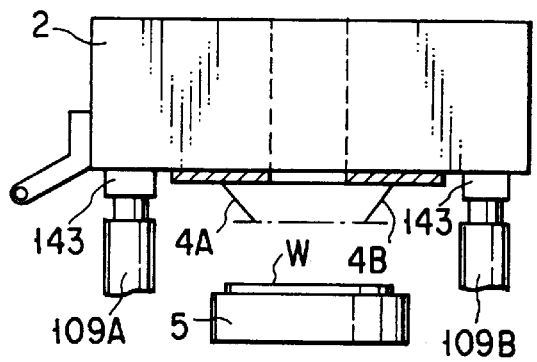
FIG. 16B
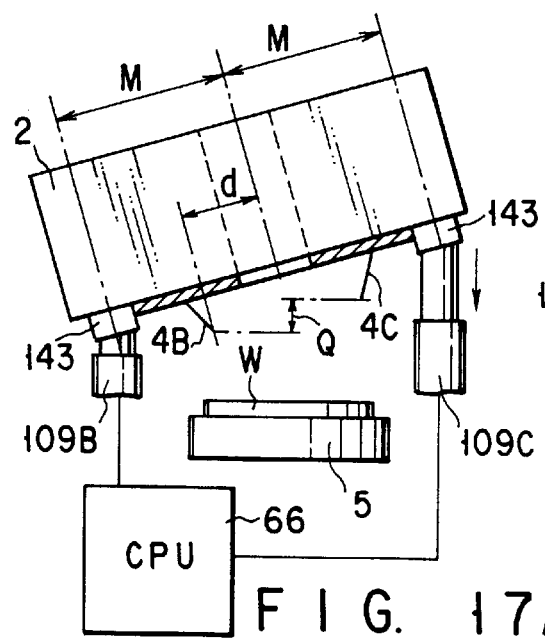
FIG. 17A
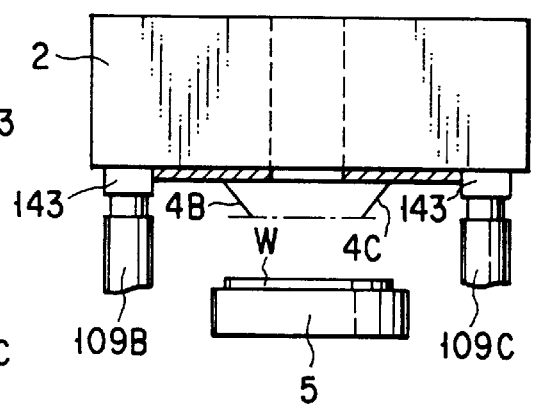
FIG. 17B

SEMICONDUCTOR WAFER PROBING APPARATUS

BACKGROUND OF THE INVENTION

1. Field of the Invention

The present invention relates to a testing apparatus for testing an object, e.g., a semiconductor wafer or an LCD substrate, on which semiconductor devices are formed.

2. Description of the Related Art

In the semiconductor manufacturing process, a large number of semiconductor chips (semiconductor devices) each having a predetermined circuit pattern are formed on a semiconductor wafer in accordance with micropatterning or the like. The semiconductor chips on the wafer are subjected to electrical characteristic tests while they are on the wafer by using a testing apparatus, e.g., a probing apparatus. Only chips that are determined to be non-defective from the result of the tests are sent to the subsequent bonding and packaging steps, thereby improving the yield of final products.

A probing apparatus of this type has, e.g., a work table for placing a wafer thereon and movable in the X, Y, Z, and θ directions, a probe card having a plurality of probe needles that are brought into electrical contact with the wafer by the movement of the work table, and a test head electrically connected to the probe card. The work table is moved to bring a plurality of electrode pads on the wafer and a plurality of corresponding probe needles into electrical contact with each other, and the electrical test of the wafer is performed by an external tester connected through the test head. At this time, when performing accurate wafer test, the needle points of the respective probe needles must accurately come into contact with the electrode pads with a substantially uniform needle pressure.

For this purpose, conventionally, a holding mechanism for holding the test head is provided to one side of the apparatus body of a probing apparatus, and the test head is held by the holding mechanism. The test head is pivoted from the maintenance region to a position above the apparatus body by the rotating mechanism of the test head. The test head is positioned on a head plate disposed on the upper surface of the apparatus body, and the probe card arranged in the head plate is electrically connected to the test head.

As the integration degree of the IC chips formed on the wafer is increased to 16M, 64M, or furthermore 256M, a high-speed operation becomes necessary. To achieve this, the tester also requires good high-frequency characteristics, so that the distance between the test head and the wafer should be reduced to shorten the length of the wiring from the test head to the wafer, for performing high-precision test with high-frequency test signal. In order to respond to this requirement, various studies have been made, and a technique disclosed in Jpn. Pat. Appln. KOKAI Publication No. 5-335385 has been proposed. According to this technique, the probe card is directly connected to the test head, any inclination of the probe card with respect to the work table that supports a wafer W is detected, and the inclination of the work table is corrected based on the detection information.

In a conventional probing apparatus, however, as shown in FIG. 10, merely a test head 72 is horizontally held on an apparatus body 70 by a holding mechanism 71, and the test head 72 on the apparatus body 70 is not fixed about movement in X and Y directions. Therefore, the needle points (each having a diameter of, e.g., 30 μm) of probe needles 75 of a probe card 74 easily cause positional shift with respect to the electrode pads (e.g., 80 μm square) of a wafer W on a work table 73, making positioning very difficult. Also, the probe needles 75 are apt to be influenced by the vibration of the apparatus body 70 upon step feeding of the work table 73 between tests, so that the contact state of the probe needles 75 is not stable, leading to a difficulty in attaining stable test. In addition, in the conventional probing apparatus, the parallel degree between the probe card 74 and the wafer W on the work table 73 cannot be accurately adjusted and variations occur in the needle pressures of the probe needles 75, making it difficult to perform accurate test.

SUMMARY OF THE INVENTION

The present invention has been made in view of the above problems, and has as its object to provide a testing apparatus in which all the contact elements fixed to the test head are accurately brought into contact with the electrodes of the object to be tested, thereby allowing highly reliable test.

It is another object of the present invention to provide a testing apparatus in which the adverse influence of vibrations of the test head is prevented during step-feeding the object to be tested, and all the contact elements fixed to the test head are accurately brought into contact with the electrodes of the object to be tested without causing a positional shift, thereby allowing highly reliable test.

According to a first aspect of the present invention, there is provided a probing apparatus which has an apparatus body and a test head detachable from the apparatus body and is used for testing electrical characteristics of a substrate to be tested, comprising:

a probe card having a plurality of contact elements to be brought into contact with the substrate, the probe card being supported by the test head;

first, second, and third engaging portions disposed on the test head around the probe card to receive a load of the test head in a distributed manner;

a work table which is vertically movable and disposed on the apparatus body to place the substrate thereon; and first, second, and third supports disposed on the apparatus body around the work table to support the test head such that the probe card opposes the work table, by respectively and detachably engaging with the first, second, and third engaging portions and supporting the test head through the first, second, and third engaging portions, respectively, the first and second supports having first and second vertical drivers to move the test head in a vertical direction through the first and second engaging portions, respectively, wherein an inclination of the probe card with respect to the substrate placed on the work table is adjusted while the test head is moved by the first and second vertical drivers.

According to a second aspect of the present invention, there is provided a testing apparatus which has an apparatus body and a movable head detachable from the apparatus body, and is used for testing a substrate to be tested, comprising:

a testing member supported by the movable head;

first, second, and third engaging portions disposed on the movable head around the testing member to receive a load of the movable head in a distributed manner;

a work table which is vertically movable and disposed on the apparatus body to place the substrate thereon;

first, second, and third supports disposed on the apparatus body around the work table to support the movable head such that the testing member opposes the work table, by respectively and detachably engaging with the first, second, and third engaging portions and supporting the movable head through the first, second, and third engaging portions, respectively, the first and second supports having first and second vertical drivers to move the movable head in a vertical direction through the first and second engaging portions, respectively, wherein an inclination of the testing member with respect to the substrate placed on the work table is adjusted while the movable head is moved by the first and second vertical drivers; and first and second intermediary members respectively interposed between the first engaging portion and the first vertical driver and between the second engaging portion and the second vertical driver, the first and second intermediary members being supported by the first and second vertical drivers to be rotatable freely within a horizontal plane.

According to a third aspect of the present invention, there is provided a testing apparatus which has an apparatus body and a movable head detachable from the apparatus body, and is used for testing a substrate to be tested, comprising:

a testing member supported by the movable head;

first, second, and third engaging portions disposed on the movable head around the testing member to receive a load of the test head in a distributed manner;

a work table which is vertically movable and disposed on the apparatus body to place the substrate thereon;

first, second, and third supports disposed on the apparatus body around the work table to support the movable head such that the testing member opposes the work table, by respectively and detachably engaging with the first, second, and third engaging portions and supporting the movable head through the first, second, and third engaging portions, respectively, the first and second supports having first and second vertical drivers to move the movable head in a vertical direction through the first and second engaging portions, respectively, wherein an inclination of the testing member with respect to the substrate placed on the work table is adjusted while the movable head is moved by the first and second vertical drivers;

first and second intermediary members respectively interposed between the first engaging portion and the first vertical driver and between the second engaging portion and the second vertical driver, the first and second intermediary members being able to be expanded and contracted in the horizontal direction in accordance with a load thereto in the vertical direction; and first and second receptacles respectively fixed to the first and second supports or the first and second engaging portions for respectively surrounding the first and second intermediary members, wherein when the first and second intermediary members are expanded upon reception of a load of the test head, the first and second intermediary members respectively come into contact with inner sides of the first and second receptacles to restrain a movement of the test head in the horizontal direction.

According to the present invention, all the contact elements fixed to the test head are accurately brought into contact with the electrodes of the object to be tested, thereby allowing highly reliable test. Also, the adverse influence of the vibration of the test head is prevented during step-feeding the object to be tested, and all the contact elements fixed to the test head are accurately brought into contact with the electrodes of the object to be tested without causing a positional shift, thereby allowing highly reliable test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a partially cutaway perspective view showing a probing apparatus according to an embodiment of the present invention;

FIG. 2 is a sectional view showing the probing apparatus shown in FIG. 1;

FIG. 3 is a sectional view showing a first support mechanism of the probing apparatus shown in FIG. 1;

FIG. 7 is an explanatory view for explaining the relationship of the inclination of the plane defined by the needle points of probe needles with respect to the wafer surface;

FIG. 8 shows the position recognition mechanism of the probing apparatus shown in FIG. 1;

FIGS. 9A to 9D are explanatory views showing how to detect the height of a probe needle by using the position recognition mechanism shown in FIG. 8;

FIG. 11 is a partially cutaway perspective view showing a probing apparatus according to another embodiment of the present invention;

FIG. 15 is a perspective view showing a chuck of the probing apparatus shown in FIG. 11;

FIGS. 16A and 16B are explanatory views showing a manner of correcting the inclination of the test head with the probing apparatus shown in FIG. 11;

FIGS. 17A and 17B are explanatory views showing another manner of correcting the inclination of the test head with 'the probing apparatus shown in FIG. 11;

DETAILED DESCRIPTION OF THE PREFERRED EMBODIMENTS

Figures 4A, 4B:
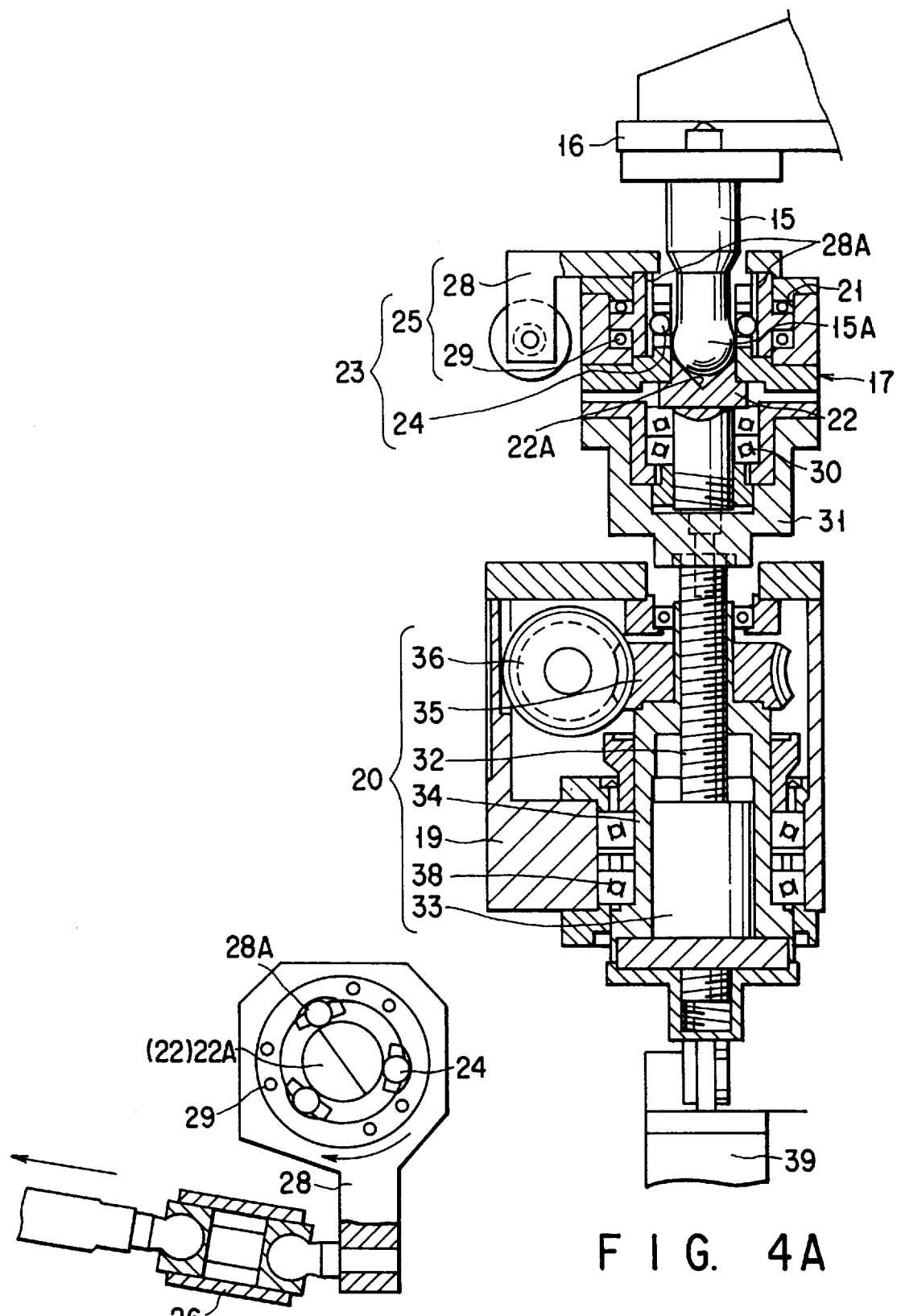
FIG. 4A is a sectional view, perpendicular to that of FIG. 3, showing the first support mechanism of the probing apparatus shown in FIG. 1.
FIG. 4B is a plan view showing the lock mechanism of the first support mechanism.

FIG. 1 shows a probing apparatus according to an embodiment of the present invention. This probing apparatus has an apparatus body 1 and a test head 2 detachably placed on the apparatus body 1. A probe card 3 having a plurality of probe needles 4 is fixed to the lower surface of the test head 2. During test, the probe needles 4 are electrically connected to the electrodes of semiconductor chips formed on an object to be tested, e.g., a semiconductor wafer W. In this state, an electric signal is supplied from a from a tester connected to the test head 2 to the chips through the probe needles 4, and the electrical characteristics of the chips are tested.

A work table 5 for placing the wafer W thereon is disposed in a probing area 6 of the apparatus body 1, i.e., below the test head 2. During test, the work table 5 is moved in the X, Y, Z, and θ directions and positioned under the control of a controller, e.g., a CPU 66 (see FIGS. 6 and 8) or the like. The work table 5 is step-fed for a distance corresponding to one IC chip mainly in the X direction to bring the electrode pads of the individual IC chips into electrical contact with the corresponding probe needles 4, thereby testing the IC chips one by one.

As shown in FIG. 1, a loading area 7 is arranged on the right side of the probing area 6. The wafer W is transferred between the work table 5 and a cassette rest area 8 by a transfer mechanism (not shown) in the loading area 7. A display 9 is disposed to display an operation panel used for operating the probing apparatus or for displaying the state of the wafer W in the apparatus body 1.

The apparatus body 1 has a base 10 formed of a 680 mm (width)×830 mm (depth)×120 mm (thickness) cast iron material. A work table driving mechanism 60 is disposed on the base 10.

More specifically, a pair of guide rails 10A extending in the Y direction are disposed on the base 10. A Y stage 61 is disposed to be movable in the Y direction along the guide rails 10A. A pair of guide rails 61A extending in the X direction are disposed on the Y stage 61. An X stage 62 is disposed to be movable in the X direction along the guide rails 61A. A Z stage 63 is disposed on the. X stage 62 to be movable in the Z direction (vertical direction). A mounting plate 64 is fixed on the Z stage 63, and the work table 5 is rotatably (in the θ direction) supported by the mounting plate 64. The Z stage 63 can vertically move a maximum of about 100 mm. The X and Y stages 62 and 61, the Z stage 63, and the work table 5 that are movable in the X, Y, Z, and θ directions, respectively, are coupled to the rotating shafts of stepping motors and various other motors.

A means, e.g., three projecting pins (not shown), for automatically loading and unloading the wafer W are arranged in the work table 5 to be ejectable and retractable. When loading and unloading the wafer W, the wafer W is transferred between the projecting pins and the transfer mechanism (not shown) of the loading area 7.

First and second support mechanisms 11 and 12 for supporting the test head 2 are disposed at three positions on the base 10. As shown in FIGS. 1 and 2, the first support mechanisms 11 are arranged as support columns each having a firm structure at two positions on the left side of the probing area 6 with a predetermined distance between them in the Y direction. The second support mechanism 12 is arranged at only one position on a support member 13 having a firm structure on the right side of the probing area 6 to substantially oppose the middle position between the two first support mechanisms 11. The first support mechanisms 11 have elevating mechanisms, as will be described later, and can adjust the support height of the test head 2 through these elevating mechanisms with reference to the support height of the second support mechanism 12.

A support frame 14 is attached to the test head 2. Engaging projections (e.g., engaging rods) 15 are vertically attached to the support frame 14 through brackets 16 to face downward. A spherical portion 15A is formed on the lower end of each engaging rod 15. The respective spherical portions 15A can be fitted in the first and second support mechanisms 11 and 12. The first and second support mechanisms 11 and 12 will be described in detail hereinafter.

As shown in FIGS. 3, 4A, and 4B, each first support mechanism 11 has a receptor 17 which is vertically movable to receive the corresponding engaging rod 15 of the test head 2. A guide mechanism 18 is supported by a stationary portion 19 to guide the receptor 17 in the vertical direction. An elevating mechanism 20 is disposed in the space of the stationary portion 19 to move the receptor 17 in the vertical direction.

A fitting hole 21 in which the spherical portion 15A of the corresponding engaging rod 15 is loosely fitted is formed in the center of the receptor 17 to extend in the vertical direction. Part of a first engaging member 22 with which the spherical portion 15A of the engaging rod 15 engages is fitted in the fitting hole 21 from below. A V-shaped groove 22A is formed in the upper surface of the first engaging member 22, and the spherical portion 15A of the engaging rod 15 engages with the V-shaped groove 22A through point contact. A lock mechanism 23 for locking the engaging rod 15 is mounted in the fitting hole 21 of the receptor 17.

As shown in FIG. 4A, the lock mechanism 23 has three hard balls 24 disposed inside a collar member 28 equiangularly in the circumferential direction. A lock actuator 25 is disposed to urge the respective hard balls 24 in the radial direction into the constricted portion of the engaging rod 15 above the spherical portion 15A. A driving cylinder (not shown) is disposed to rotate the lock actuator 25 about the axis of the fitting hole 21 as the center in the forward and reverse directions through a link mechanism 26 (see FIG. 4B).

The lock actuator 25 is constituted by the collar member 28 mounted in the fitting hole 21 and having a lever, and small balls 29 mounted between the outer circumferential surface of the collar member 28 and the inner circumferential surface of the fitting hole 21. Recessed portions 28A are formed in the inner circumferential surface of the collar member 28 to correspond to the hard balls 24, as shown in FIG. 4B. When the respective recessed portions 28A coincide with the hard balls 24, the hard balls 24 allow the spherical portion 15A of the engaging rod 15 to freely pass through. When the lock actuator 25 is rotated by the cylinder as shown in FIG. 4B, the recessed portions 28A move away from the hard balls 24. Thus, the hard balls 24 are pushed by the inner surface of the collar member 28 to proceed to the constricted portion above the spherical portion 15A, thereby locking the engaging rod 15.

Figure 6:
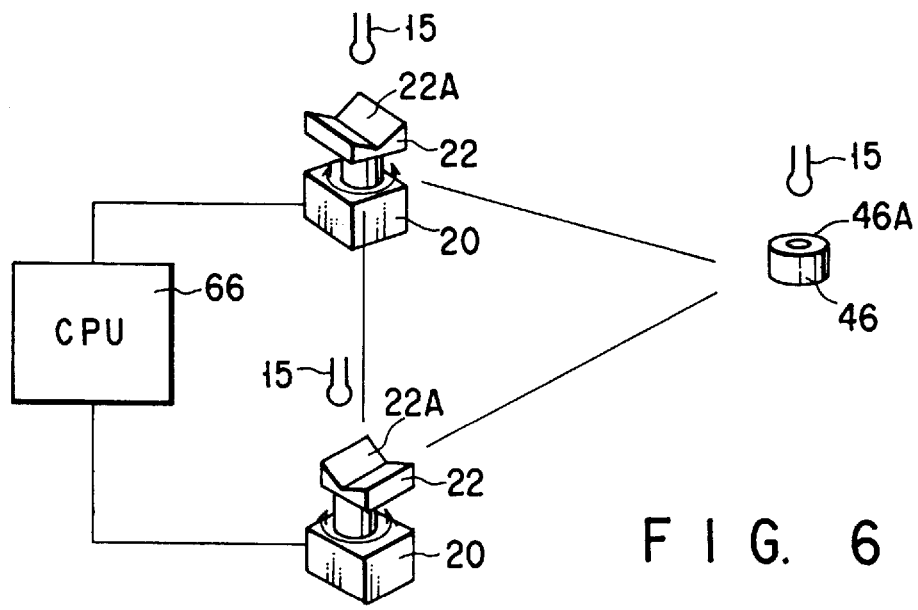
FIG. 6 is a perspective view showing the relationship among the first engaging members of the first support mechanisms, the second engaging member of the second support mechanism, and the engaging rods of the test head.
Figure 10:
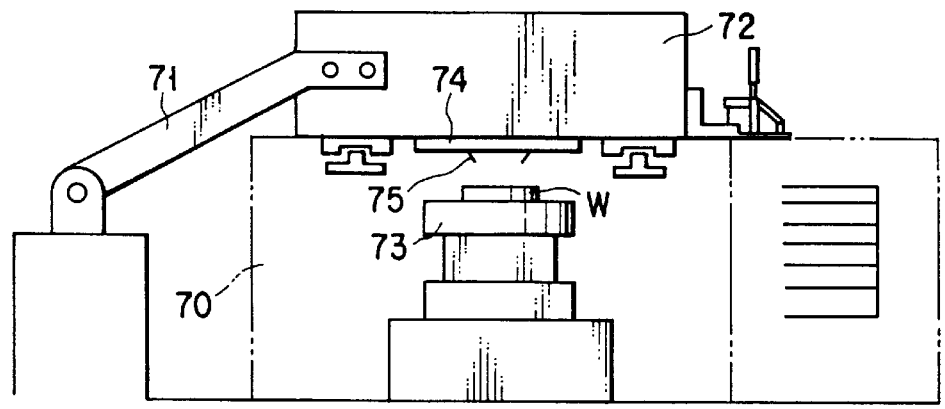
FIG. 10 is a side view showing a conventional probing apparatus.

The first engaging member 22 is formed of an engaging portion having the V-shaped groove 22A formed in its upper side and a lower shaft portion vertically continuous to the lower surface of the engaging portion. The shaft portion of the first engaging member 22 is mounted in the recessed portion of a receptor 31 through a ball bearing 30. In the receptor 31, the first engaging member 22 is rotatable through the shaft portion. The axis of the engaging rod 15 is slightly eccentric from the axis of the shaft portion of the first engaging member 22, as shown in FIG. 3. When the engaging rod 15 engages with the V-shaped groove 22A, a moment corresponding to the distance of eccentricity acts on the first engaging member 22 to direct the V-shaped groove 22A in a certain direction, as shown in FIG. 6.

A ball screw 32 constituting the elevating mechanism 20 is coupled to the lower surface of the receptor 31. The elevating mechanism 20 is accommodated in the internal space of the stationary portion 19, as described above. The elevating mechanism 20 has, e.g., a nut member 33 threadably engaging with the ball screw 32, a rotary cylinder 34 for fixing the nut member 33, a worm wheel 35 mounted on the upper portion of the rotary cylinder 34, a worm 36 meshing with the worm wheel 35, and a stepping motor 37 for driving the worm 36 to rotate.

The rotary cylinder 34 is rotated by the stepping motor 37 in the forward and reverse directions in the internal space of the stationary portion 19 through a ball bearing 38. Then, the first engaging member 22 is vertically moved in the Z direction for a predetermined distance through the nut member 33 and the ball screw 32. The stepping motor 37 rotates in the forward and reverse directions for a predetermined amount based on a command signal from the controller 66 which is based on a detection value obtained upon detection of the height of the needle point of a probe needle 4, as will be described later.

A rotary encoder 39 is disposed below the rotary cylinder 34, and the rotation amount of the rotary cylinder 34 is detected by the rotary encoder 39. When the rotation amount of the rotary cylinder 34 reaches the command value, the controller 66 outputs a stop signal to the stepping motor 37 to stop the elevating mechanism 20.

As shown in FIG. 3, the guide mechanism 18 has a pair of right and left guide rods 18A coupled to the lower surface of the receptor 17, and guide bushes 18B. The guide rods 18A can move -in the vertical direction to fit in the guide bushes 18B. When the receptor 17 is vertically moved by the elevating mechanism 20, the guide rods 18A move vertically while they are guided by the guide bushes 18B.

Figure 5:
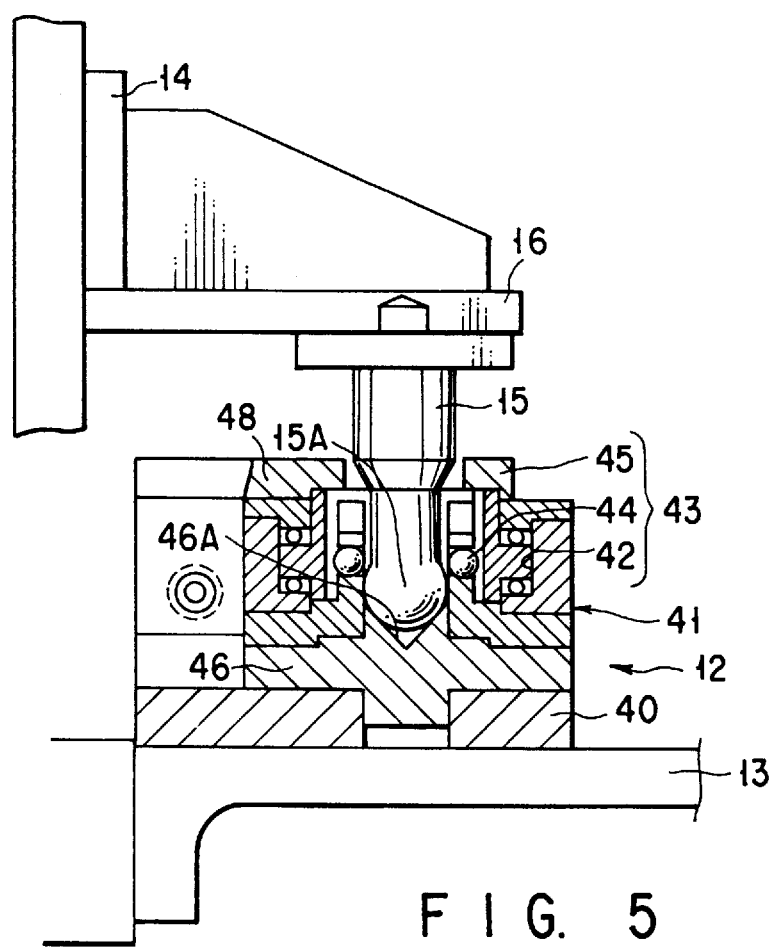
FIG. 5 is a sectional view showing the second support mechanism of the probing apparatus shown in FIG. 1.

As shown in FIG. 5, the second support mechanism 12 is mainly constituted by a receptor 41 disposed on a stationary portion 40 to receive the engaging rod 15 of the test head 2. A fitting hole 42 in which the spherical portion 15A of the engaging rod 15 is loosely fitted is formed to extend through substantially the center of the receptor 41. A lock mechanism 43 for locking the engaging rod 15 is mounted in the fitting hole 42. The lock mechanism 43 has three hard balls 44, a lock actuator 45 having a collar member 48, and the like, as shown in FIG. 5, and is formed in the same manner as the lock mechanism 23 of the first support mechanism 11. A second engaging member 46 is interposed between the stationary portion 40 and the receptor 41. The spherical portion 15A of the engaging rod 15 fitted through the fitting hole 42 engages with an inverted circular conical hole 46A formed in the projecting portion at the center of the second engaging member 46.

Accordingly, the first engaging members 22 of the two first support mechanisms 11 and the second engaging member 46 of the one second support mechanism 12 engage with the corresponding engaging rods 15 of the test head 2 on the apparatus body 1, as shown in FIG. 6. The engaging members 22 move in the vertical direction through the respective elevating mechanisms 20 with reference to the height of the second engaging member 46. Hence, any inclination of the test head 2 is corrected to set the probe card 3 and the wafer W on the work table 5 parallel to each other.

When the test head 2 is supported by the first and second support mechanisms 11 and 12, as shown in FIG. 2, the probe card 3 fixed to the test head 2 and the wafer W on the work table 5 are not sometimes held to be parallel to each other depending on the inclination of the test head 2. FIG. 7 shows an example of this case. Referring to FIG. 7, on the probe card 3, e.g., a plane B defined by the four probe needles 4A to 4D has an inclination Dn in the X direction and an inclination Dm in the Y direction with respect to a plane A of the wafer W on the work table 5. These inclinations can be detected by a position recognition mechanism 50 shown in FIG. 8. For this purpose, the position recognition mechanism 50 calculates the heights of a plurality of, e.g., the four probe needles 4A to 4D, with respect to the surface of the wafer W.

The position recognition mechanism 50 has a first camera 51, a target 52, and a second camera 53, as shown in FIG. 2. The first camera 51 comprises a CCD camera or the like disposed on the mounting plate 64 integral with the Z stage 63. The target 52 is disposed to be able to move toward and away from the focal point of the first camera 51. The second camera 53 comprises a CCD camera or the like supported by a bridge 54 which reciprocates in the horizontal direction above the work table 5.

The bridge 54 is provided to extend between a pair of guide rails 55 disposed to oppose each other. A ball screw 56 is disposed to correspond to the intermediate portions of the guide rails 55 to be parallel to them, and a pulse motor 57 is directly coupled to the ball screw 56. A ball nut (not shown) provided to the bridge 54 threadably engages with the ball screw 56. An encoder 58 is connected to the pulse motor 57. When a single pulse is input to the pulse motor 57, the moving amount of the encoder 58 is determined, and the second camera 53 is moved by, e.g., 5 microns.

As another manner of driving the bridge 54, the bridge 54 can be driven by an air cylinder (not shown) to move horizontally to a stopper (not shown) fixed at a predetermined position.

FIGS. 9A to 9D are views showing a method of detecting the heights of the needle points of the probe needles 4 with respect to the wafer W.

First, as shown in FIG. 9A, the second camera 53 is moved to a position under the center of the probe card 3. Subsequently, the work table 5 is moved to align the target 52 with the focal point of the second camera 53, so that the optical axes of the first and second cameras 51 and 53 are caused to coincide with each other to detect the reference coordinate point (XO,YO,ZO) of each of the two cameras 51 and 53 on the X-Y-Z coordinate system.

The work table 5 is moved to below the second camera 53, as shown in FIG. 9B. Then, the work table 5 is moved upward as shown in FIG. 9C to cause an electrode pad on the surface of the wafer W to coincide with the focal point of the second camera 53, and the coordinate point (Xc,Yc,Zc) of this electrode pad is detected. The work table 5 is moved as shown in FIG. 9D to align the focal point of the first camera 51 with the needle point of a probe needle 4, and a coordinate point (Xp,Yp,Zp) of this needle point is detected.

The position of the needle point of the probe needle 4 (e.g., the probe needle 4A) with respect to the electrode pad on the surface of the wafer W in the three-dimensional coordinate system is obtained by using the arithmetic calculating means of the controller 66 based on the coordinate points detected in this manner. The positions of the needle points of other probe needles 4B to 4D are obtained in accordance with the same sequence. The focal point of the first camera 51 and the position of the target 52 are adjusted in advance to coincide with each other with good reproducibility.

Thereafter, the inclination of the test head 2, if any, is calculated by the arithmetic calculating means based on the height differences among the needle points of these probe needles 4A to 4D. The controller 66 transmits command signals representing these differences to the stepping motors 37 of the first support mechanisms 11 to move the first engaging members 22 in the vertical direction, thereby correcting the inclination of the probe card 3. In this manner, the probe card 3 and the wafer W can be adjusted to be parallel to each other.

The operation of the probing apparatus shown in FIG. 1 will be described.

Prior to the start of test of the wafer W, the test head 2 is moved to above the apparatus body 1 by using a predetermined moving unit (not shown), and is placed on the apparatus body 1. During the placement, the engaging rods 15 at the three positions of the lower surface of the test head 2 are aligned with the fitting holes 21 and 42 of the first and second support mechanisms 11 and 12 standing up at the three positions of the base 10 of the apparatus body 1. In this state, when the test head 2 is moved downward, the three engaging rods 15 fit in the collar members 28 and 48 of the corresponding fitting holes 21 and 42.

When the spherical portions 15A of the two engaging rods 15 engage with the V-shaped grooves 22A of the first engaging members 22 of the first support mechanisms 11, the first engaging members 22 rotate in the receptors 31 through the ball bearings 30 to direct the V-shaped grooves 22A in predetermined directions, as shown in FIG. 6. The spherical portion 15A of the remaining engaging rod 15 engages with the inverted circular conical hole 46A of the second engaging member 46 of the second support mechanism 12 to determine the support point of the second engaging member 46. Subsequently, the lock mechanisms 23 and 43 are driven to lock the corresponding engaging rods 15 in the fitting holes 21 and 42. Hence, the test head 2 will not disengage from the first and second support mechanisms 11 and 12.

At this time point, however, the test head 2 is often inclined with respect to the work table 5 so that the probe card 3 is not parallel to the surface of the work table 5. Therefore, the position recognition mechanism 50 operates to detect the needle points of the predetermined probe needles 4A to 4D of the probe needles 4 of the probe card 3. The height differences among the respective needle points are obtained by the arithmetic calculating means of the controller 66, and the inclination of the test head 2 is calculated based on these calculation results. The controller 66 transmits command signals based on these calculation results to the stepping motors 37 of the first support mechanisms 11 to drive the elevating mechanisms 20.

When the stepping motors 37 of the first support mechanisms 11 are driven, the corresponding rotary cylinders 34 rotate through the worms 36 and the worm wheels 35. The ball screws 32 are vertically moved through the nut members 33 by the rotation of the corresponding rotary cylinders 34, thereby vertically moving the first engaging members 22. Accordingly, the test head 2 engaging with the first engaging members 22 through the engaging rods 15 is vertically moved by the two first support mechanisms 11. As a result, the inclination of the test head 2 can be corrected with reference to the support point of the second support mechanism 12, so that the probe card 3 can be set parallel to the work table 5.

If the probe card 3 of the test head 2 becomes parallel to the work table 5, when the wafer W is placed on the work table 5, the electrode pads of the wafer W can be reliably brought into contact with the corresponding plurality of probe needles 4. Accordingly, the electrical test of the wafer W can be performed reliably.

Subsequently, the wafer W serving as the object to be tested is placed on the work table 5 in the probing area 6 from the loading area 7 by the transfer mechanism. The work table 5 is moved in the X, Y, Z, and θ directions under the control of the controller 66 to position the wafer W. The electrical characteristics of the respective IC chips of the wafer W are tested while moving the work table 5.

During the test, the work table 5 performs step feeding for a distance corresponding to, e.g., one IC chip in the X direction. During this step feeding, a vibration is generated mainly in this feed direction, i.e., in the X direction, in the base 10 by the inertial force of the work table 5. This vibration is transmitted to the test head 2 through the base 10 and the first and second support mechanisms 11 and 12.

However, the test head 2 is supported while the two engaging rods 15 are locked with the two first support mechanisms 11 separated apart from each other in the Y direction and the remaining engaging rod 15 is locked with the one second support mechanism 12 separated apart from the first support mechanisms 11 in the X direction. Thus, the vibration of the test head 2 in the X direction is suppressed or prevented by the first and second support mechanisms 11 and 12. The vibration in the Y direction is largely smaller than that in the X direction along which step feeding is performed. Regarding the vibration of the test head 2 in the Y direction, as the test head 2 is supported while the two engaging rods 15 are locked with the two first support mechanisms 11 separated apart from each other, also this vibration can be prevented.

Therefore, the vibration of the test head 2 becomes drastically smaller than that of the conventional probing apparatus. Accordingly, the probe needles 4 will not shift from the corresponding electrode pads due to vibrations caused by step feeding during test. Hence, the probe needles 4 and the electrode pads come into reliable contact with each other to allow reliable test of the IC chips.

As described above, according to this embodiment, the probe card 3 is directly fixed by the test head 2, the test head 2 is supported by the first and second support mechanisms 11 and 12 at three positions, and any inclination of the test head 2 can be adjusted. Therefore, high-frequency measurement can be performed reliably. More specifically, the rotatable first engaging members 22 which engage with the engaging rods 15 of the test head 2 to be movable relative to the engaging rods 15, and the elevating mechanisms 20 for vertically moving the first engaging members 22 are disposed in the first support mechanisms 11. The second engaging member 46 which engages with the corresponding engaging rod 15 of the test head 2 is disposed in the second support mechanism 12. Accordingly, the inclination of the test head 2, if any, is adjusted through the elevating mechanisms 20.

Even if the parallel state between the probe card 3 fixed to the test head 2 and the wafer W on the work table 5 is disturbed due to an assembly error or the like, the inclination of the test head 2 can be adjusted by the elevating mechanisms 20 of the first support mechanisms 11. Consequently, the probe needles 4 can be reliably brought into contact with the electrodes pads of the wafer W, so that the electrical characteristics of the individual IC chips of the wafer W can be tested reliably.

When adjusting the inclination of the test head 2, in the first support mechanisms 11, the engaging rods 15 can move along the V-shaped grooves 22A of the first engaging members 22. For this reason, the head inclination can be adjusted smoothly.

The two first support mechanisms 11 are arranged in a direction perpendicular to the direction along which the work table 5 is continuously step-fed. The second support mechanism 12 is arranged at a position opposite to the first support mechanisms 11 through the moving region of the work table 5. Therefore, even when the work table 5 is step-fed in the X direction during test, the vibration of the test head 2 in the X direction can be reliably suppressed or prevented by the two first support mechanisms 11 and the one second support mechanism 12. As a consequence, positional shifts of the probe needles 4 from the electrode pads of the wafer W are eliminated, so that the electrical characteristics of the individual IC chips of the wafer W can be tested reliably.

The engaging rods 15 of the test head 2 have the spherical portions 15A at their lower ends. Meanwhile, the first engaging members 22 of the first support mechanisms 11 have V-shaped grooves that engage with the spherical portions 15A. The second engaging member 46 of the second support mechanism 12 has an inverted circular conical hole which engages with the corresponding spherical portion 15A. Therefore, when adjusting the inclination of the test head 2, the first engaging members 22 of the first support mechanisms 11 are moved in the vertical direction with reference to the support point of the engaging rod 15 supported by the second support mechanism 12, thereby adjusting the inclination of the test head 2 smoothly and reliably.

The first and second support mechanisms 11 and 12 have the lock mechanisms 23 that protrude onto the spherical portions 15A of the corresponding engaging rods 15 to fix the test head 2. Thus, even during test, the test head 2 can be reliably fixed at a position adjusted by the first support mechanisms 11, thereby preventing positional shifts of the probe needles 4 more reliably.

In the probing apparatus of this embodiment, the first support mechanisms 11 are provided at two positions, and the second support mechanism 12 is provided at one position. However, first support mechanisms 11 may be provided at two right positions and two left positions, i.e., a total of four positions.

FIGS. 11 to 19 show a probing apparatus according to another embodiment of the present invention. In FIGS. 11 to 19, portions that are identical to those in FIGS. 1 to 9 are denoted by the same reference numerals, and a detailed description thereof will be made only when necessary.

Figure 12:
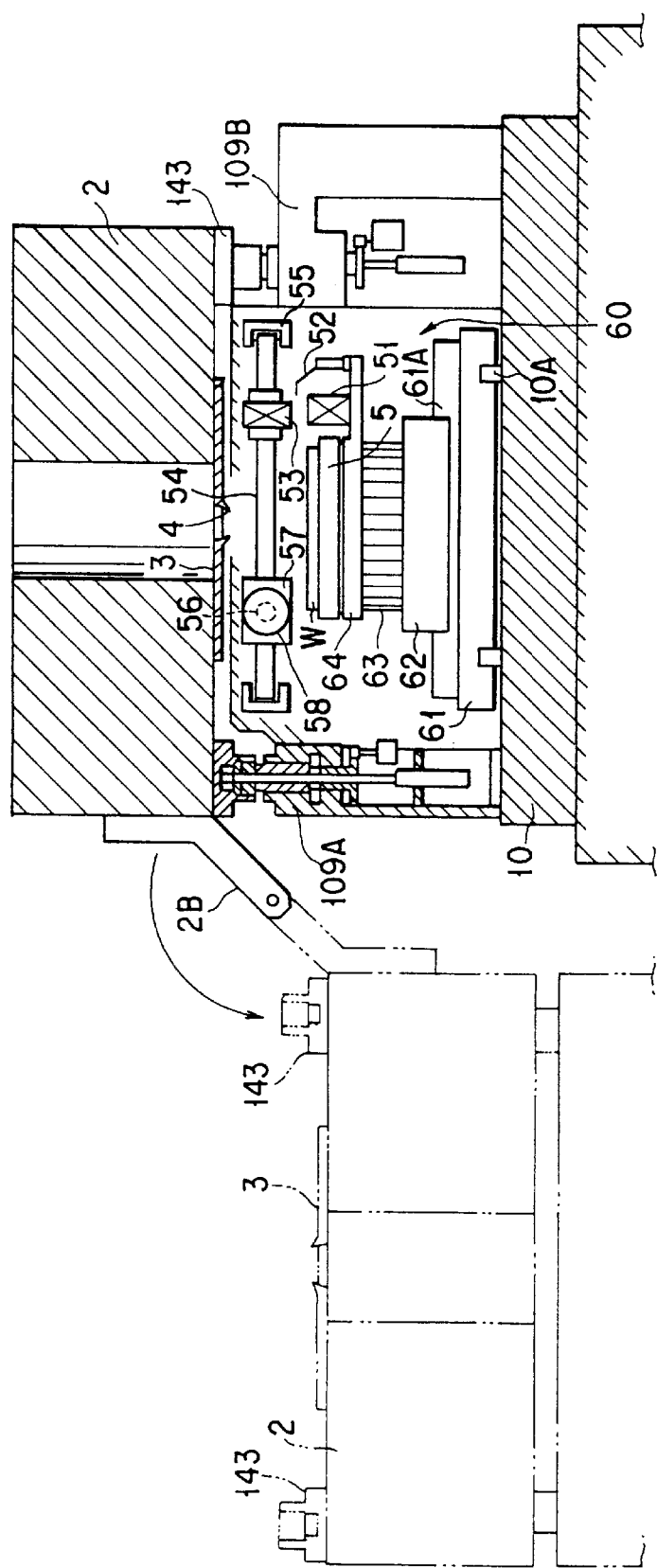
FIG. 12 is a sectional view showing the probing apparatus shown in FIG. 11.
Figure 13:
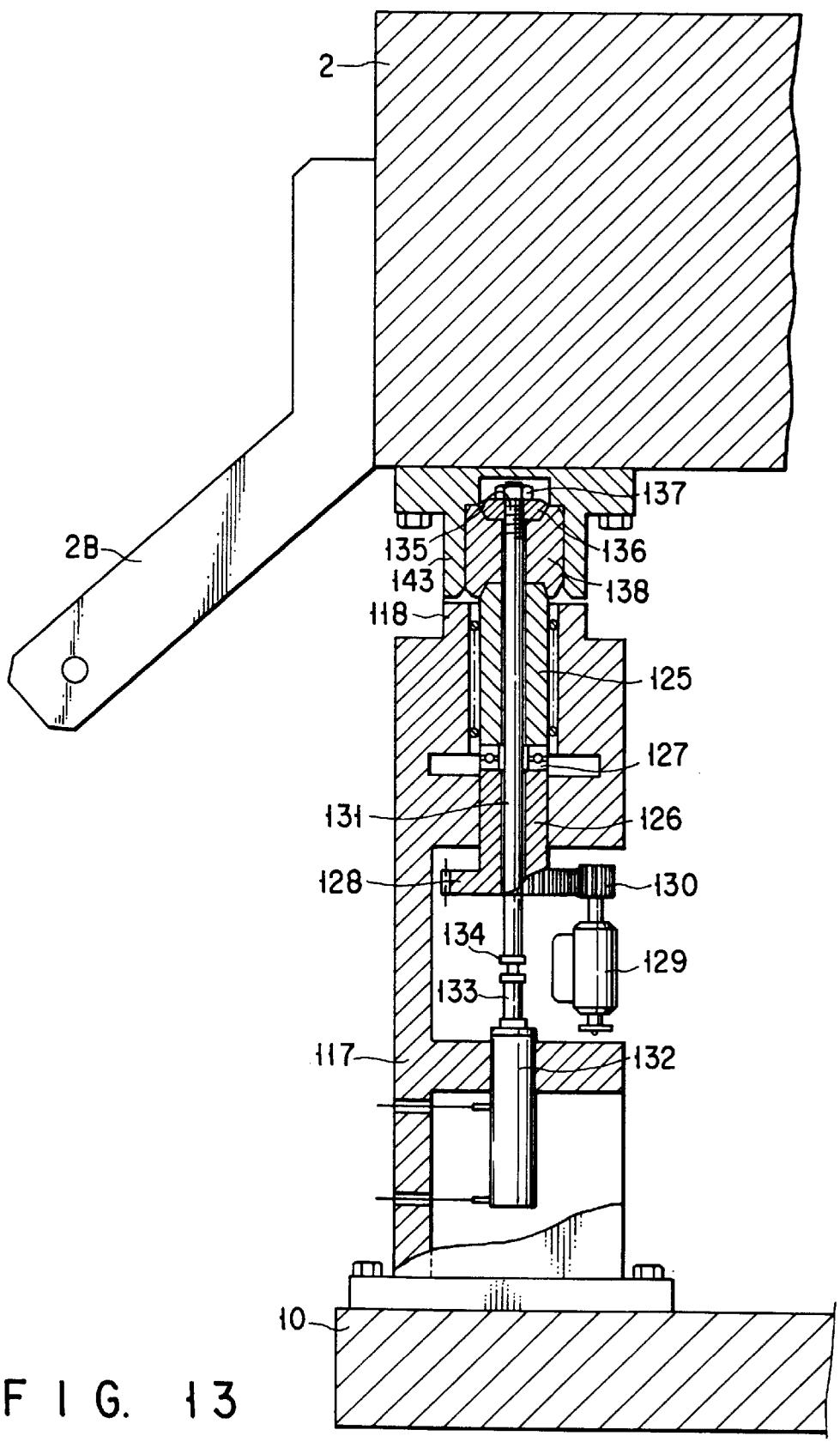
FIG. 13 is a sectional view showing a support mechanism of the probing apparatus shown in FIG. 11.

In this probing apparatus, a pivotal driving mechanism 2A is disposed on one side portion of an apparatus body 1. A test head 2 connected to a tester is supported by an arm 2B of the pivotal driving mechanism 2A. When the arm 2B of the pivotal driving mechanism 2A is pivoted, the test head 2 can move between the use position and the retreat position, as shown in FIG. 12.

Support mechanisms 109A, 109B, and 109C for supporting the test head 2 are disposed at least at three positions in the peripheral portion of the apparatus body 1. The support mechanisms 109A, 109B, and 109C are preferably arranged at equal distances from the center of a work table driving mechanism 60 and equiangularly from each other. As the support mechanisms 109A, 109B, and 109C have the same structure, only one of them will be described with reference to FIGS. 13 and 14.

A circularly columnar pole 117 having an outer diameter of, e.g., 45 mm, vertically stands on a base 10. A small-diameter portion 118 having an outer diameter of, e.g., 35 mm, is disposed on the upper portion of the pole 117. Three stages of hollow portions 117C to 117E are vertically disposed in the lower portion of the pole 117 through partitioning walls 117A and 117B. The upper side hollow portion 117C communicates with a through hole 119 extending through the axial portion of the pole 117.

Figure 14:
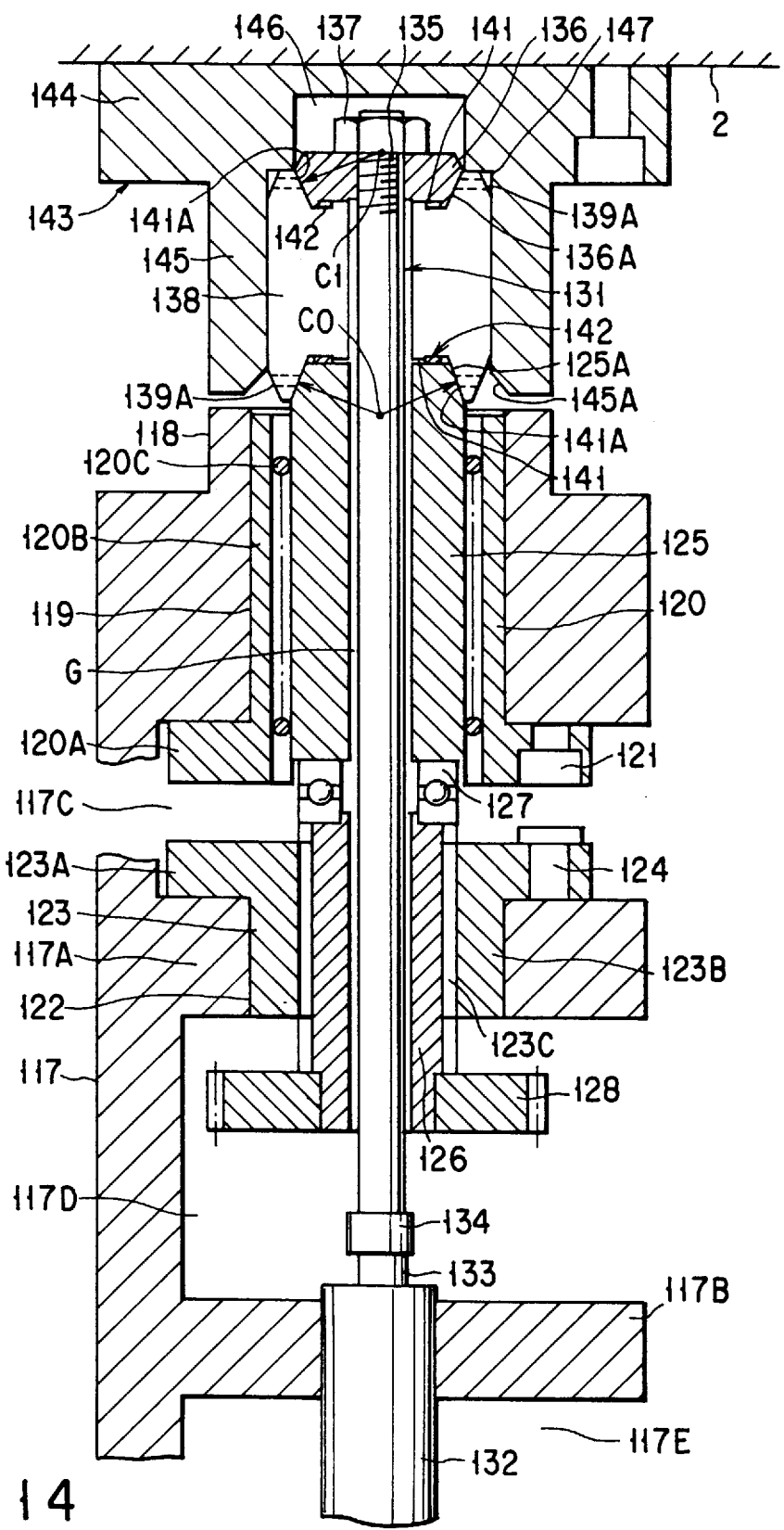
FIG. 14 is a sectional view, perpendicular to that of FIG. 13, showing the support mechanism of the probing apparatus shown in FIG. 11.

A ball bearing 120 shown in FIG. 14 is inserted in the through hole 119. The ball bearing 120 is constituted by a sleeve 120B having a flange 120A, and a plurality of balls 120C arranged inside the inner circumferential surface of the sleeve 120B in the axial direction. The flange 120A is fixed on the upper surface of the upper side hollow portion 117C with a bolt 121.

A through hole 122 is formed in the upper partitioning wall 117A to be concentric with the through hole 119, and a screw bush 123 is inserted in the through hole 122. The screw bush 123 is constituted by a sleeve 123B having a flange 123A, and a trapezoidal screw portion 123C formed on the inner circumferential surface of the sleeve 123B. The flange 123A is fixed on the lower surface of the upper hollow portion 117C with a bolt 124.

A cylindrical, first up-and-down member 125 is fitted in the ball bearing 120 to be movable in the vertical direction. A screw cylinder 126 is fitted in the screw bush 123 to threadably engage with the screw portion 123C. The precision of the vertical movement is determined by the screw pitch of the screw portion 123C. A thrust bearing 127 is interposed between the lower end face of the first up-and-down member 125 and the upper end face of the screw cylinder 126.

The lower end portion of the screw cylinder 126 projects as far as to the middle hollow portion 117D, and a driven gear 128 is fitted on the lower end portion of the screw cylinder 126. The driven gear 128 meshes with a driving gear 130 of a motor 129 disposed in the hollow portion 117D.

A shaft 131 extends through the first up-and-down members 125 and the screw cylinder 126 to be vertically movable. A gap G is formed between the shaft 131 and the first up-and-down member 125. The lower end portion of the shaft 131 projects as far as to the middle hollow portion 117D, and this lower end portion is coupled to a rod 133 of a cylinder 132, vertically fixed to the lower partitioning wall 117B, through a joint 134.

The upper end portion of the shaft 131 projects further upward from the upper end portion of the first up-and-down member 125, and a screw portion 135 is disposed on this upper end portion. A second up-and-down member 136 is fixed to the screw portion 135 with a nut 137. Accordingly, the first and second up-and-down members 125 and 136 are disposed separated from each other in the vertical direction, and a chuck 138 serving as a positioning and fixing member is disposed between the first and second up-and-down members 125 and. 136 to fit on the shaft 131.

The chuck 138 is used to absorb slight shifts of the test head 2 in the X and Y directions when the test head 2 is move in the Z direction, and also to fix the position of the test head 2 in the X and Y directions. As shown in FIG. 15, the chuck 138 has an outer circumferential wall formed of a cylinder 139 of 32 mm (outer diameter)×8.5 mm (inner diameter)×35 mm (height) and made of a tool steel or a bearing steel. Slots 140 are formed in the outer circumferential wall of the cylinder 139 at 16 equal angular intervals (with an angle of 22.5 degrees) alternately from the upper side to the lower side and vice versa while partially leaving the outer circumferential surface to reach the inner surface from the outer surface. Recessed portions 141 each having the shape of a frustum of cone are formed on the upper and lower end faces, respectively, of the cylinder 139. Tapered portions 139A each having a small-diameter distal end are formed on the outer peripheral portions of the upper and lower ends, respectively, of the cylinder 139 to cover slight shifts in the X and Y directions.

The chuck 138 having the above arrangement can be manufactured by forming the slots 140 in the cylinder 139 as described above, winding a wire on the outer surface of the cylinder 139 and clamping the cylinder 139 with the wire to reduce the diameter, quenching the cylinder 139, and thereafter forming the cylinder 139 into a barrel. The chuck 138 can be radially expanded and contracted, and its diameter is increased upon application of a pressure in the axial direction to determine the position of the test head 2 in the X and Y directions.

The chuck 138 is interposed between the first and second up-and-down members 125 and 136 while it is fitted on the shaft 131 shown in FIG. 14. A spherical surface 125A having a point $C_0$ on the axis as the center of curvature is formed on the upper end portion of the first up-and-down member 125. The spherical surface 125A abuts against one tapered inner circumferential surface 141A formed on the corresponding recessed portion 141 of the chuck 138. A spherical surface 136A having a point $C_1$ on the axis as the center of curvature is formed on the lower end portion of the second up-and-down member 136. The spherical surface 136A abuts against the other tapered inner circumferential surface 141A formed on the other corresponding recessed portion 141 of the chuck 138. Corrugated washers 142 are respectively interposed between the first up-and-down member 125 and the chuck 138, and between the chuck 138 and the second up-and-down member 136.

A receptacle 143 serving as an engaging member is fixed to the lower surface of the test head 2, as shown in FIG. 14. The receptacle 143 is formed into such a size that its cylinder 145 having a flange 144 can enclose the chuck 138 entirely. When no load is applied to the chuck 138, i.e., when the chuck 138 is in a diameter-contracted state, the chuck 138 loosely fits in the cylinder 145. When, however, the diameter of the chuck 138 is expanded as will be described later, the chuck 138 engages with the cylinder 145 to be able to fix the test head 2 at an optimum position in the X and Y directions and further in the axial direction (i.e., in the vertical direction). Note that a chuck 138 may be attached to a flange 144 and a cylinder 145 may be attached to the top portion of a pole 117.

A chamfered portion 145A is formed on the open end of the cylinder 145. A recessed portion 146 for receiving the upper end portion of the shaft 131 including the nut 137, and an abutting portion 147 for abutting against the upper end face of the chuck 138 are formed deep in the cylinder 145.

When the three receptacles 143 disposed on the lower surface of the test head 2 are supported by the three support mechanisms 109A, 109B, and 109C disposed in the apparatus body 1 1 as shown in FIG. 12, the probe card 3 fixed to the test head 2 and the wafer W on the work table 5 are sometimes held not parallel to each other depending on the inclination of the test head 2. FIG. 7 described above shows an example of this case. As described above, this inclination can be detected by the position recognition mechanism 50 shown in FIG. 8 in accordance with the method shown in FIGS. 9A to 9D.

The CPU 66 corrects the inclination of the test head 2 in the following manner by utilizing the detection results obtained by the method shown in FIGS. 9A to 9D.

For example, assume that the distance between the probe needles 4A and 4B is set to $2d=6$ mm and that the distance between the support mechanisms 109A and 109B is set to $2L=600$ mm, as shown in FIGS. 16A and 16B. In this case, if a height difference P between the probe needles 4A and 4B is 20 microns, −500 pulses are input to the motor 129 in order to move the first up-and-down member 125 of the support mechanism 109B downward for 2,000 microns.

Similarly, for example, assume that the distance between the probe needles 4B and 4C is set to $2d=6$ mm and that the distance between the support mechanisms 109B and 109C is set to $2M=400$ mm, as shown in FIGS. 17A and 17B. In this case, if a height difference Q between the probe needles 4B and 4C is 25 microns, −417 pulses are input to the motor 129 in order to move the first up-and-down member 125 of the support mechanism 109C downward for 1,667 microns.

A method of positioning the test head of this probing apparatus will be described.

When the pivotal driving mechanism 2A shown in FIG. 11 is driven to pivot the arm 2B, the test head 2 retreated aside the apparatus body 1 pivots to be loaded on a predetermined position on the apparatus body 1 together with the probe card 3.

As described above, the support mechanisms 109A to 109C are disposed at the three positions in the apparatus body 1 to support the test head 2, and the receptacles 143 are disposed on the test head 2 to correspond to the respective support mechanisms 109A to 109C. Accordingly, the test head 2 is supported by the apparatus body 1 at three points.

Figure 18:
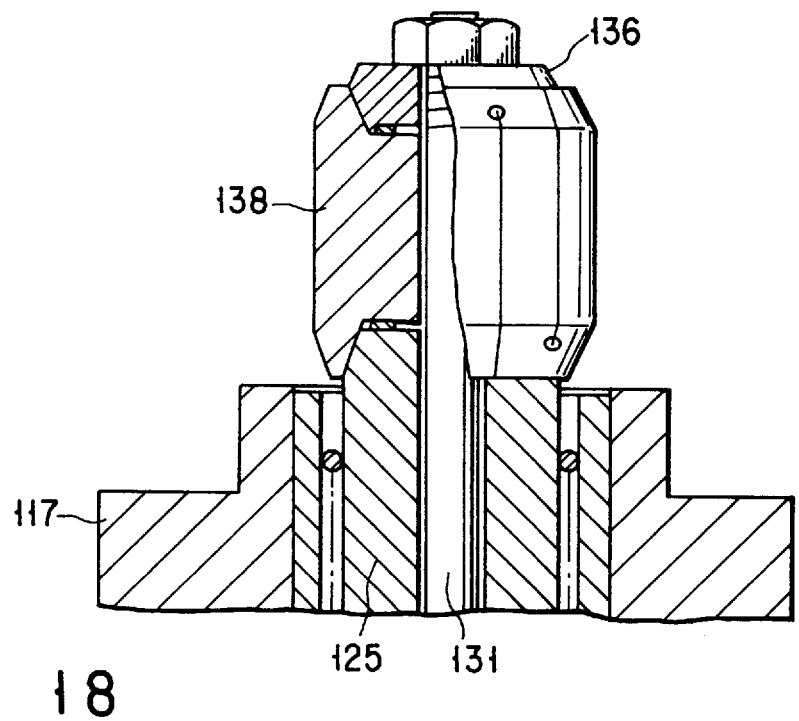
FIG. 18 is a sectional view showing a state wherein the diameter of the chuck of the probing apparatus shown in FIG. 11 is decreased with no load being applied to it.

The chucks 138 are disposed in the support mechanisms 109A to 109C. As shown in FIG. 18, since the chuck 138 is in a diameter-contracted state when no load is applied to it, it loosely fits in the cylinder 145 of the corresponding receptacle 143. More specifically, even if the positions of the chuck 138 and the receptacle 143 relatively shift from each other more or less, as the chuck 138 has a smaller diameter than that of the corresponding cylinder 145, the chuck 138 is formed with the tapered portion 139A, and the chamfered portion 145A is formed on the cylinder 145, the chuck 138 reliably fits in the cylinder 145 to allow rough positioning.

When the chucks 138 and the receptacles 143 fit with each other, the load of the test head 2, e.g., 500 kg, acts on the chucks 138 as the pressure in the axial direction through the abutting portions 147. The chucks 138 are sandwiched by the first and second up-and-down members 125 and 136 with this pressure.

Figure 19:
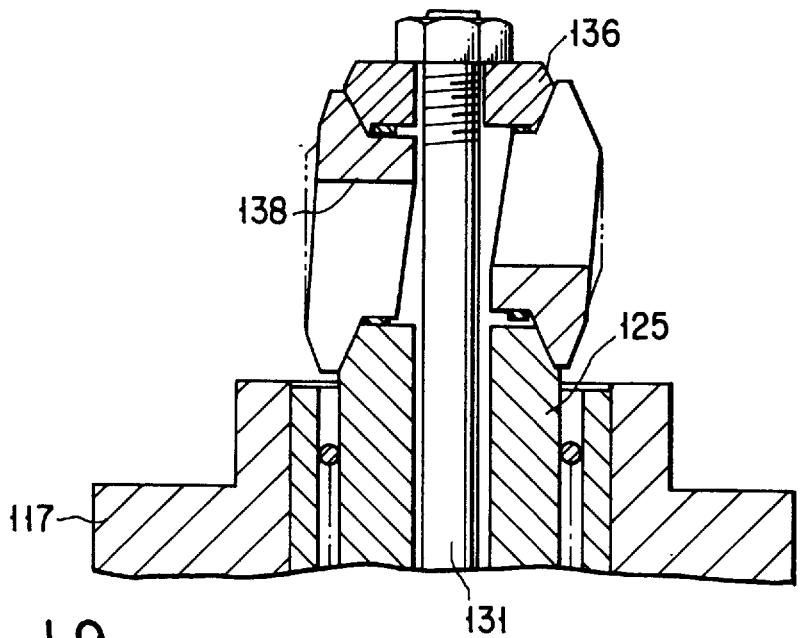
FIG. 19 is a sectional view showing a state wherein the diameter of the chuck of the probing apparatus shown in FIG. 11 is increased with a pressure.

Therefore, as shown in FIG. 19, the spherical surface 125A at the upper end portion of the first up-and-down member 125 urges the tapered inner circumferential surface 141A formed on the inner wall surface of the recessed portion 141 of the chuck 138 outward. Thus, the lower portion of the chuck 138 is radially expanded and is pressed against the inner circumferential surface of the cylinder 145 of the receptacle 143 to be fixed temporarily. More specifically, upon application of the load, the test head 2 is positioned in the X and Y directions. In this case, even if the test head 2 inclines with respect to the work table 5 serving as the horizontal reference plane of the apparatus body 1 and the cylinder 145 of the support frame 143 inclines with respect to the vertical line, the test head 2 can be held well by the chuck 138. More specifically, although the chuck 138 inclines with respect to the shaft 131, as shown in FIG. 19, it can be held reliably due to the presence of the spherical surfaces 125A and 136A on the first and second up-and-down members 125 and 136.

A case will be described wherein the test head 2 is inclined with respect to the horizontal reference plane of the apparatus body 1 and this inclination is to be corrected, i.e., wherein the height of the test head 2 is to be adjusted.

First, when the motor 129 is driven to rotate the driven gear 128 through the driving gear 130, the screw cylinder 126 rotates. As the screw cylinder 126 threadably engages with the screw portion 123C of the bush 123, the screw cylinder 126 moves upward or downward while rotating.

The upward or downward movement of the screw cylinder 126 is transmitted to the chuck 138 through the first up-and-down member 125, and is then to the test head 2 through the receptacle 143, so that the height of the test head 2 can be adjusted. More specifically, when the support mechanisms 109A to 109C are driven independently of each other, the inclination of the test head 2 can be corrected to a desired state, e.g., to a horizontal state, and can be maintained in this state.

Then, the rod 133 is moved downward by the cylinder 132 of each of the support mechanisms 109A to 109C, so that the second up-and-down member 136 is moved downward by the shafts 131, and the spherical surface 136A urges the tapered inner circumferential surfaces 141A of the chucks 138 strongly. Therefore, the upper portion of the chuck 138 is radially expanded to be locked by the receptacles 143, so that the test head 2 is fixed with respect to the support mechanisms 109A to 109C. That is, positioning of the test head 2 on the X-Y plane is completed.

When retreating the test head 2 from the apparatus body 1, the shaft 131 is pushed upward by the cylinder 132, and the second up-and-down member 136 is separated from the chuck 138. This reduces the diameter of the chuck 138 to unlock it. Thereafter, the pivotal driving mechanism 2A is driven.

In the probing apparatus shown in FIG. 11, the support mechanisms are provided at three positions to support the test head at three points, and the respective support mechanisms are moved upward or upward. However, the height of the test head 2 can be adjusted at least by moving the two support mechanisms upward or downward. More specifically, for example, one support mechanism is set to pivotally axially support the test head 2 through spherical bearings, pivot bearings, or the like, while the remaining two support mechanisms are set to be movable in the vertical direction, in the same manner as in the probing apparatus shown in FIG. 11. In this case, the remaining two support mechanisms are moved upward or downward with reference to the spherical bearing, the pivot bearing, or the like at one position. Note that the number of positions where the support mechanisms are provided is not limited to three, but can be four or more.

In the above embodiment, the support mechanisms are provided on the base of the apparatus body. However, the support mechanisms may be supported by a frame separate from the apparatus body. Also, the support mechanisms may be supported on a plate provided on the upper surface of the apparatus body. The support mechanisms may be attached at any positions as far as they do not interfere with other members disposed in the apparatus body.

Figure 20:
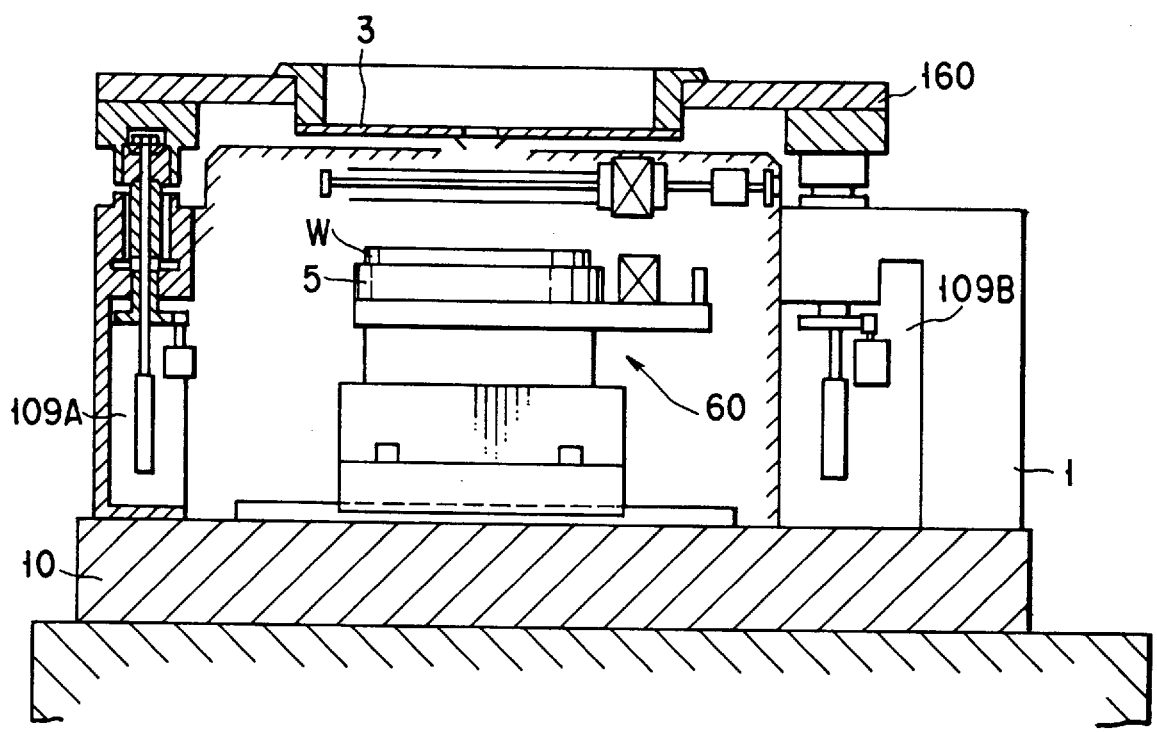
FIG. 20 is a sectional view showing the main part of a probing apparatus according to still another embodiment of the present invention.

FIG. 20 shows the main part of a probing apparatus according to still another embodiment of the present invention. In FIG. 20, portions that are identical to those in FIGS. 11 to 19 are denoted by the same reference numerals, and a detailed description thereof will be omitted.

In this probing apparatus, a head plate 160 is loaded on the upper portion of an apparatus body 1, and a probe card 3 is disposed in the head plate 160. Support mechanisms 109A to 109C are disposed at three positions in the apparatus body 1. The head plate 160 is supported by these support mechanisms 109A to 109C to be movable in the vertical direction. In this probing apparatus as well, one support mechanism can be set to pivotally axially support the head plate 160 through a spherical bearing, a pivot bearing, or the like, while the remaining two support mechanisms can be set to be movable in the vertical direction. In this case, the remaining two support mechanisms are moved vertically with reference to the spherical bearing, the pivot bearing, or the like at one position. The number of positions where the support mechanisms are provided is not limited to three, but can be four or more.

Figure 21:
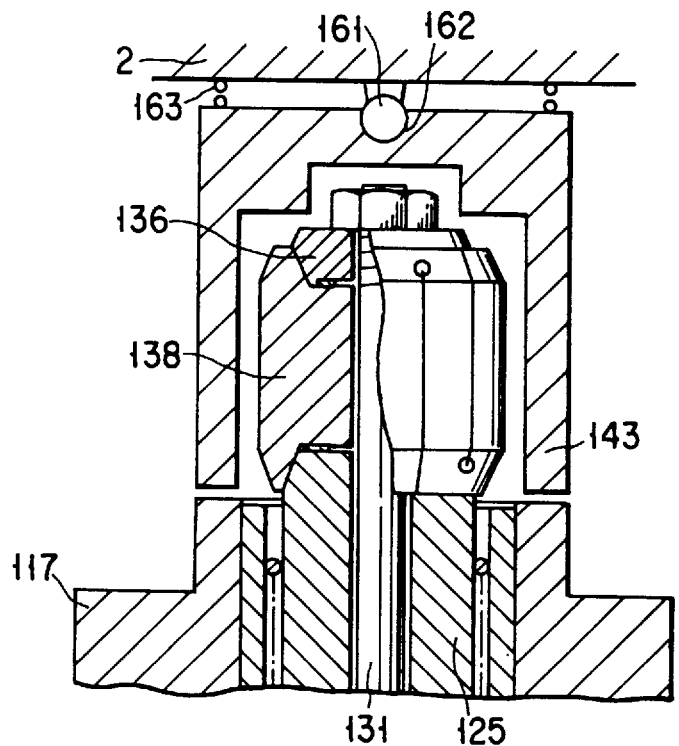
FIG. 21 is a sectional view showing the main part of a probing apparatus according to still another embodiment of the present invention.

FIG. 21 shows the main part of a probing apparatus according to still another embodiment of the present invention. In FIG. 21, portions identical to those in FIGS. 11 to 19 are denoted by the same reference numerals, and a detailed description thereof will be omitted.

In the probing apparatus shown in FIGS. 11 to 19, the receptacles 143 are fixed to the lower surface of the test head 2. In the probing apparatus shown in FIG. 21, receptacles 143 are swingably supported by a test head 2. More specifically, spherical members 161 made of stainless steel or the like are disposed on the lower surface of the test head 2, and spherical recessed portions 162 that fit on the spherical members 161 are disposed in the receptacles 143. Furthermore, coil springs 163 are interposed in a compressed state between the lower surface of the test head 2 and the upper surfaces of the receptacles 143. The receptacles 143 are directed in the vertical direction by the biasing force of the coil springs 163. Accordingly, the receptacles 143 and chucks 138 can fit with each other smoothly.

In the above embodiments, the present invention is applied to a wafer probing apparatus. However, the present invention is not limited to a wafer probing apparatus, but can be applied to various types of testing apparatuses each of which consists of a stationary portion and a movable portion having a test head and must position the movable portion in the X, Y, and Z directions at high precision.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probing apparatus which has an apparatus body and a test head detachable from said apparatus body and is used for testing electrical characteristics of a substrate to be tested, comprising:

a probe card having a plurality of contact elements to be brought into contact with the substrate, said probe card being supported by said test head;

first, second, and third engaging portions disposed on said test head around said probe card to receive a load of said test head in a distributed manner;

a work table which is vertically movable and disposed on said apparatus body to place the substrate thereon; and first, second, and third supports disposed on said apparatus body around said work table to support said test head such that said probe card opposes said work table, by respectively and detachably engaging with said first, second, and third engaging portions and supporting said test head through said first, second, and third engaging portions, respectively, said first and second supports having first and second vertical drivers to move said test head in a vertical direction through said first and second engaging portions, respectively, wherein an inclination of said probe card with respect to the substrate placed on said work table is adjusted while said test head is moved by said first and second vertical drivers.

2. An apparatus according to claim 1, further comprising a position recognition mechanism for detecting an inclination of said probe card with respect to the substrate.

3. An apparatus according to claim 2, wherein said first and second vertical drivers and said position recognition mechanism are connected to a controller, and said controller controls said first and second vertical drivers based on detection information output from said position recognition mechanism.

4. An apparatus according to claim 3, wherein said work table is supported on a stage which is movable in directions of three-dimensional axes and which can drive said work table to rotate within a horizontal plane, and said position recognition mechanism has first image pickup means attached to said stage such that a field of view thereof is directed upward to pick up an image of said contact elements, second image pickup means disposed above said work table such that a field of view thereof is directed downward to pick up an image of the substrate, and a target supported by said stage to align focal points and optical axes of said first and second image pickup means with each other.

5. An apparatus according to claim 4, wherein the substrate has a plurality of regions to be tested, said work table sequentially brings the regions to be tested into contact with said contact elements while moving in a first horizontal direction, said first and second supports are arranged with a space therebetween in a direction perpendicular to the first horizontal direction, and said third support is arranged to oppose said first and second supports through said work table.

6. An apparatus according to claim 1, further comprising first and second intermediary members respectively interposed between said first engaging portion and said first vertical driver and between said second engaging portion and said second vertical driver, said first and second intermediary members being supported by said first and second vertical drivers to be rotatable freely within a horizontal plane.

7. An apparatus according to claim 6, wherein said first and second intermediary members are disposed on said first and second vertical drivers, respectively, such that a center of rotation of each of said first and second intermediary members and a center of a load applied to each of said first and second intermediary members by a corresponding one of said first and second engaging portions are eccentric from each other.

8. An apparatus according to claim 7, wherein said first and second engaging portions respectively have first and second projections having spherical surfaces at lower ends thereof, and said first and second intermediary members have V-shaped grooves having inner sides against which said spherical surfaces of said first and second projections abut.

9. An apparatus according to claim 8, wherein said third engaging portion has a third projection having a spherical surface at a lower end thereof, and said third support has a circular conical hole having an inner side against which said spherical surface of said third projection abuts.

10. An apparatus according to claim 9, wherein said first, second, and third projections have constricted portions, respectively, and said first, second, and third supports have lock members, respectively, to enter corresponding ones of said constricted portions to lock a vertical movement of said first, second, and third engaging portions.

11. An apparatus according to claim 1, further comprising first and second intermediary members respectively interposed between said first engaging portion and said first vertical driver and between said second engaging portion and said second vertical driver, said first and second intermediary members being able to be expanded and contracted in the horizontal direction in accordance with a load thereto in the vertical direction, and first and second receptacles respectively fixed to said first and second supports or said first and second engaging portions for respectively surrounding said first and second intermediary members, wherein when said first and second intermediary members are expanded upon reception of a load of said test head, said first and second intermediary members respectively come into contact with inner sides of said first and second receptacles to restrain a movement of said test head in the horizontal direction.

12. An apparatus according to claim 11, wherein said first and second intermediary members comprise cylinders which have a plurality of slots in outer circumferential surfaces thereof to extend in an axial direction and which can be expanded and contracted in a radial direction.

13. An apparatus according to claim 12, wherein said first and second supports respectively further comprise means for clamping said first and second intermediary members in the vertical direction to apply a load thereto, thereby expanding said first and second intermediary members in the radial direction.

14. A testing apparatus which has an apparatus body and a movable head detachable from said apparatus body, and is used for testing a substrate to be tested, comprising:

a testing member supported by said movable head;

first, second, and third engaging portions disposed on said movable head around said testing member to receive a load of said movable head in a distributed manner;

a work table which is vertically movable and disposed on said apparatus body to place the substrate thereon;

first, second, and third supports disposed on said apparatus body around said work table to support said movable head such that said testing member opposes said work table, by respectively and detachably engaging with said first, second, and third engaging portions and supporting said movable head through said first, second, and third engaging portions, respectively, said first and second supports having first and second vertical drivers to move said movable head in a vertical direction through said first and second engaging portions, respectively, wherein an inclination of said testing member with respect to the substrate placed on said work table is adjusted while said movable head is moved by said first and second vertical drivers; and first and second intermediary members respectively interposed between said first engaging portion and said first vertical driver and between said second engaging portion and said second vertical driver, said first and second intermediary members being supported by said first and second vertical drivers to be rotatable freely within a horizontal plane.

15. An apparatus according to claim 14, wherein said first and second intermediary members are disposed on said first and second vertical drivers, respectively, such that a center of rotation of each of said first and second intermediary members and a center of a load applied to each of said first and second intermediary members by a corresponding one of said first and second engaging portions are eccentric from each other.

16. An apparatus according to claim 15, wherein said first and second engaging portions respectively have first and second projections having spherical surfaces at lower ends thereof, and said first and second intermediary members have V-shaped grooves having inner sides against which said spherical surfaces of said first and second projections abut.

17. An apparatus according to claim 16, wherein said third engaging portion has a third projection having a spherical surface at a lower end thereof, and said third support has a circular conical hole having an inner side against which said spherical surface of said third projection abuts.

18. An apparatus according to claim 17, wherein said first, second, and third projections have constricted portions, respectively, and said first, second, and third supports have lock members, respectively, to enter corresponding ones of said constricted portions to lock a vertical movement of said first, second, and third engaging portions.

19. A testing apparatus which has an apparatus body and a movable head detachable from said apparatus body, and is used for testing a substrate to be tested, comprising:

a testing member supported by said movable head;

first, second, and third engaging portions disposed on said movable head around said testing member to receive a load of said movable head in a distributed manner;

a work table which is vertically movable and disposed on said apparatus body to place the substrate thereon;

first, second, and third supports disposed on said apparatus body around said work table to support said movable head such that said testing member opposes said work table, by respectively and detachably engaging with said first, second, and third engaging portions and supporting said movable head through said first, second, and third engaging portions, respectively, said first and second supports having first and second vertical drivers to move said movable head in a vertical direction through said first and second engaging portions, respectively, wherein an inclination of said testing member with respect to the substrate placed on said work table is adjusted while said movable head is moved by said first and second vertical drivers;

first and second intermediary members respectively interposed between said first engaging portion and said first vertical driver and between said second engaging portion and said second vertical driver, said first and second intermediary members being able to be expanded and contracted in the horizontal direction in accordance with a load thereto in the vertical direction; and first and second receptacles respectively fixed to said first and second supports or said first and second engaging portions for respectively surrounding said first and second intermediary members, wherein when said first and second intermediary members are expanded upon reception of a load of said test head, said first and second intermediary members respectively come into contact with inner sides of said first and second receptacles to restrain a movement of said test head in the horizontal direction.

20. An apparatus according to claim 19, wherein said first and second intermediary members comprise cylinders which have a plurality of slots in outer circumferential surfaces thereof to extend in an axial direction and which can be expanded and contracted in a radial direction.

21. An apparatus according to claim 20, wherein said first and second supports respectively further comprise means for clamping said first and second intermediary members in the vertical direction to apply a load thereto, thereby expanding said first and second intermediary members in the radial direction.

* * * * *